United States Patent
Cheng

(10) Patent No.: US 7,441,329 B2
(45) Date of Patent: Oct. 28, 2008

(54) FABRICATION PROCESS CIRCUIT BOARD WITH EMBEDDED PASSIVE COMPONENT

(75) Inventor: Shih-Lian Cheng, Tainan (TW)

(73) Assignee: Subtron Technology Co. Ltd., Hsinchu (TW)

( * ) Notice: Subject to any disclaimer, the term of this patent is extended or adjusted under 35 U.S.C. 154(b) by 131 days.

(21) Appl. No.: 10/908,987

(22) Filed: Jun. 3, 2005

(65) Prior Publication Data

US 2005/0282309 A1 Dec. 22, 2005

(30) Foreign Application Priority Data

Jun. 7, 2004 (TW) ............... 93116298 A
Mar. 8, 2005 (TW) ............... 94106905 A

(51) Int. Cl.
*H01R 43/00* (2006.01)
(52) U.S. Cl. .............. 29/825; 29/830; 29/831; 29/832; 29/833; 29/846; 438/107; 438/108; 438/109; 438/382; 438/401; 361/748; 361/760; 361/761; 361/762; 361/763; 361/764; 361/765; 361/766
(58) Field of Classification Search ......... 438/107–109, 438/382, 401; 361/748, 760–766; 29/825, 29/830–833, 846
See application file for complete search history.

(56) References Cited

U.S. PATENT DOCUMENTS

| | | | | |
|---|---|---|---|---|
| 7,013,561 | B2* | 3/2006 | Nakatani et al. | 29/852 |
| 2002/0117743 | A1* | 8/2002 | Nakatani et al. | 257/687 |
| 2003/0090883 | A1* | 5/2003 | Asahi et al. | 361/761 |
| 2004/0231885 | A1* | 11/2004 | Borland et al. | 174/260 |
| 2005/0111206 | A1* | 5/2005 | Borland et al. | 361/761 |
| 2005/0176209 | A1* | 8/2005 | Jorgenson et al. | 438/381 |
| 2006/0278967 | A1* | 12/2006 | Tuominen et al. | 257/686 |

* cited by examiner

*Primary Examiner*—Zandra Smith
*Assistant Examiner*—Bac H Au
(74) *Attorney, Agent, or Firm*—Jianq Chyun IP Office

(57) ABSTRACT

A process for fabricating a circuit board with embedded passive component is provided. A conductive layer including a first surface and a second surface opposing to the first surface is provided. The conductive layer has first through holes passing through the conductive layer, respectively. At least one passive component material layer is formed on the first surface. A circuit unit including second through holes is provided. Locations of the second through holes are corresponding to the locations of the first through holes, respectively. The conductive layer and the circuit unit are aligned by the first through holes and the second through holes, while the first surface of the conductive layer faces the circuit unit, and the passive component material layer is between the circuit unit and the conductive layer. The conductive layer is laminated to the circuit unit. The conductive layer is patterning to form a circuit layer.

10 Claims, 22 Drawing Sheets

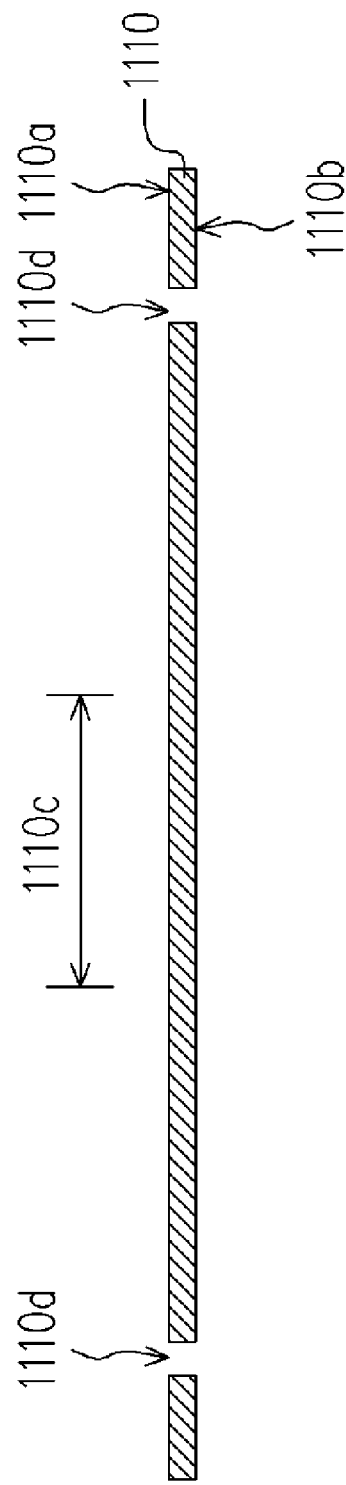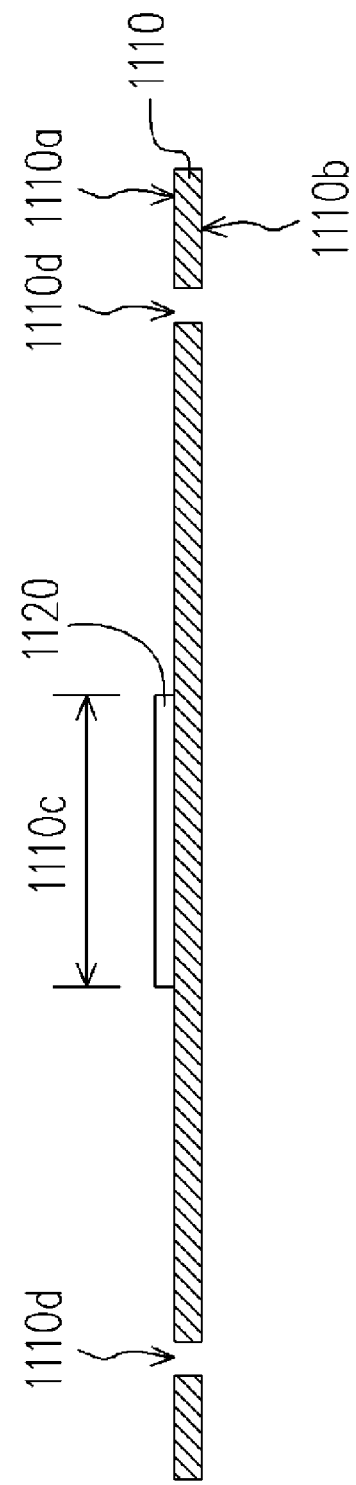

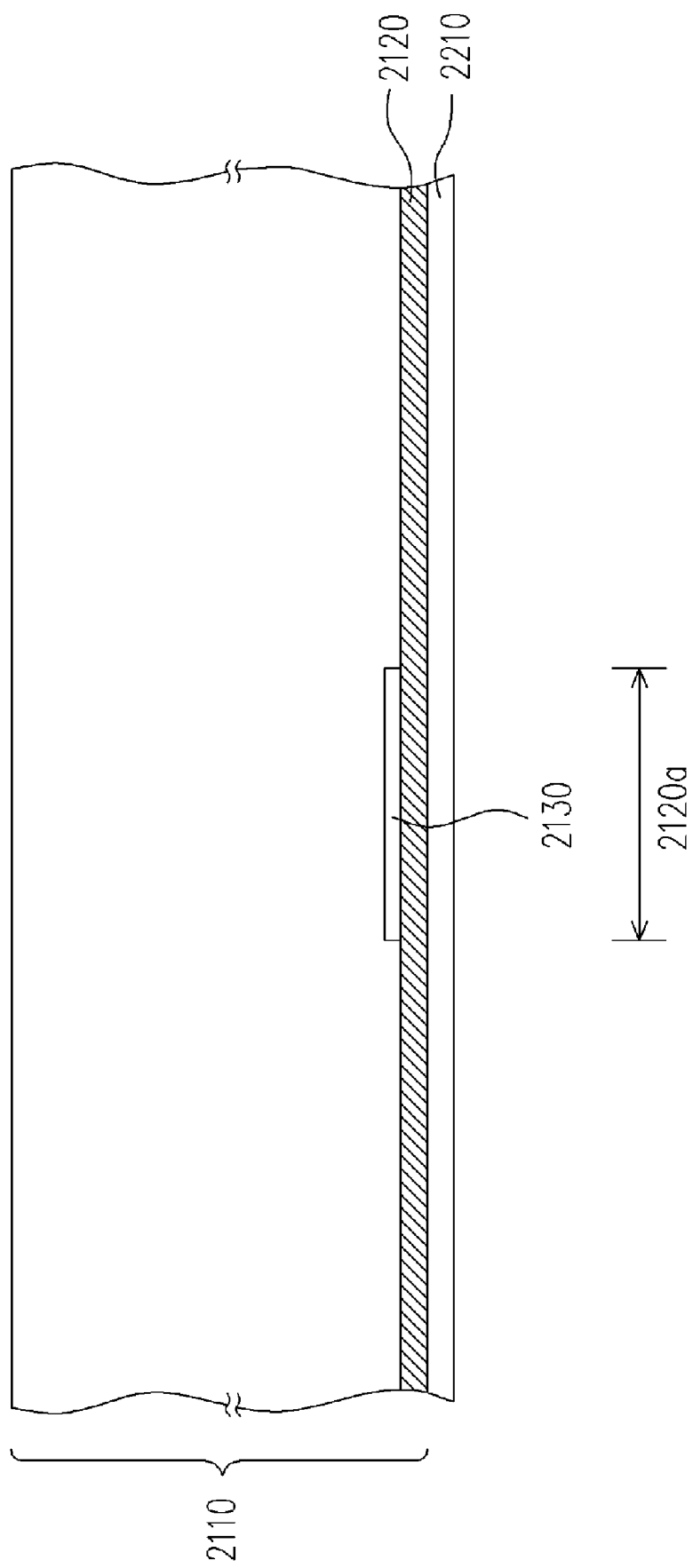

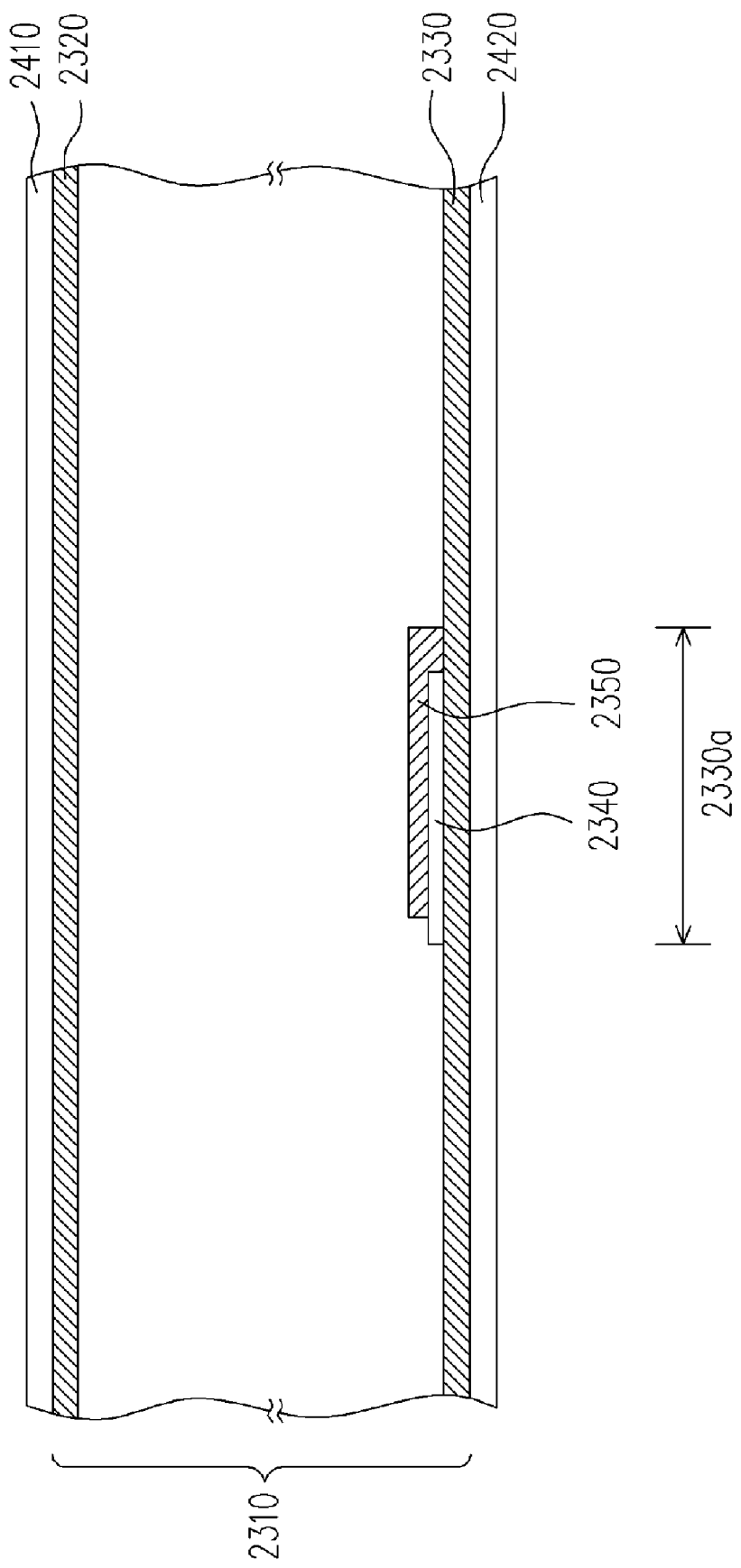

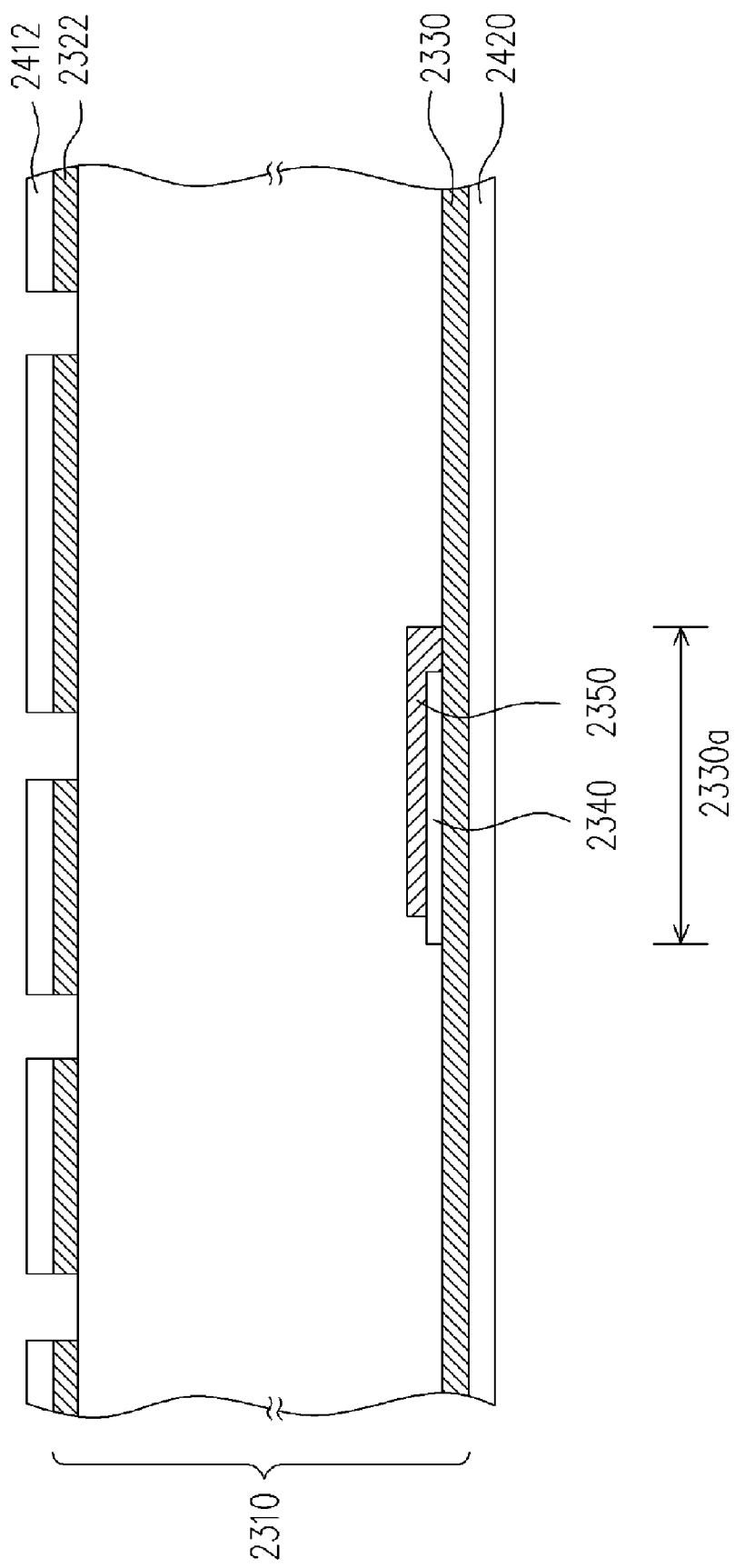

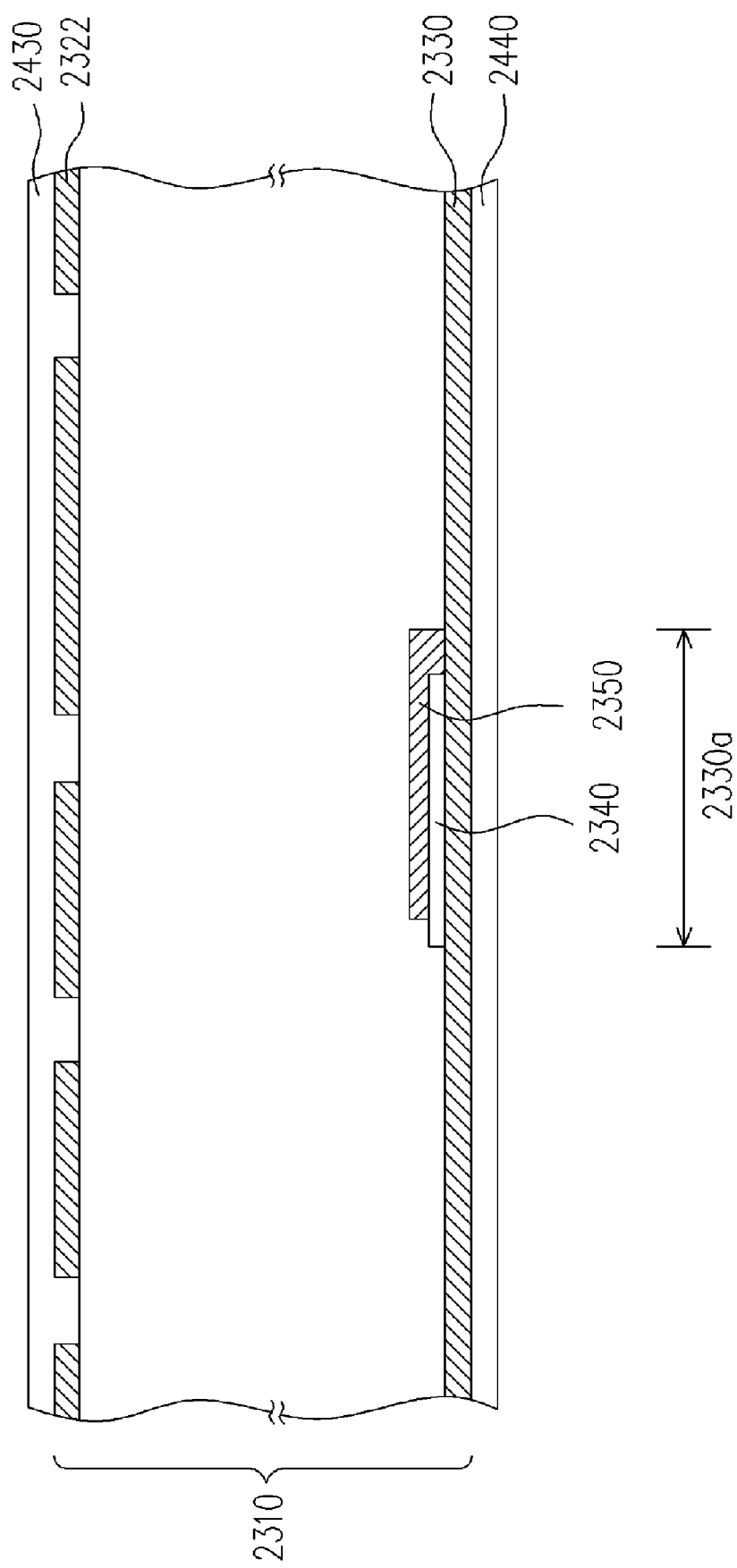

“FABRICATION PROCESS CIRCUIT BOARD WITH EMBEDDED PASSIVE COMPONENT”

CROSS-REFERENCE TO RELATED APPLICATION

This application claims the priority benefit of Taiwan applications Ser. No. 93116298, filed on Jun. 7, 2004, and Ser. No. 94106905, filed on Mar. 8, 2005. All disclosure of these Taiwan applications is incorporated herein by reference.

BACKGROUND OF THE INVENTION

1. Field of Invention

The present invention relates to a circuit board and its fabrication process, specifically, to a circuit board with embedded passive component and the fabrication process thereof.

2. Description of Related Art

As the integration level of electronic products is getting higher and higher, the circuit layer of high integration electronic products has evolved into 6-layer, 8-layer and even 10-layer from single-layer and dual-layer circuit, so that the electronic components can be mounted on the printed circuit board. Generally speaking, the most common fabrication process of circuit board is the lamination process. The alignment precision between the circuit layers and the isolation layer must be well controlled when the lamination process is used to fabricate circuit boards. Therefore, in the fabrication process of the circuit board, usually a plurality of the alignment marks are formed on the insulating layer where the circuit layers are located, and these marks are used to align the insulating layers and one or two of the circuit layers on the surfaces of the insulating layers, and then these insulating layers and circuit layers are laminated, so that the multi-layer circuit boards or the semi-finished products are formed.

FIG. 1A and FIG. 1B illustrate cross-sectional views of the fabrication process of the conventional multi-layer printed circuit board. With reference to the FIG. 1A and FIG. 1B, the fabrication process of the conventional multi-layer printed circuit board includes the following steps: First, a substrate 10 including an insulating layer 12, two circuit layers 14 and an alignment mark 16 is provided, wherein the two circuit layers 14 are respectively located on the two surfaces of the insulating layer 12, and the alignment mark 16 is on a surface of the insulating layer 12.

Next, a first substrate 20 and a second substrate 30 are respectively located on both sides of substrate 10. The first substrate 20 and the second substrate 30 respectively have the dielectric layers 22 and 32, the circuit layers 24 and 34, and the first alignment mark 26 and the second alignment mark 36 (the top-view of the alignment mark 16, the first alignment mark 26 and the second alignment mark 36 is shown as the circled area in the figures), while the circuit layer 24 and the first alignment mark 26 are collocated on a surface of the first substrate 20, and the circuit layer 34 and the second alignment mark 36 are collocated on a surface of the second substrate 30. Next, the alignment step of aligning the substrate 10, the first substrate 20 and the second substrate 30 is completed by use of rivet and X-ray to check the alignment mark 16 of the substrate 10, the first alignment mark 26 of the first substrate 20 and the second alignment mark 36 of the second substrate 30.

With reference to the FIG. 1B, after completing the alignment step, the substrate 10, the first substrate 20 and the second base layer 30 are subjected to a heat laminating and curing process to form a multi-layer printed circuit board or a semi-finished printed circuit board. Remarkably, the alignment mark 16, the first alignment mark 26 and the second alignment mark 36 are all formed through ink printing, therefore, there is an alignment error existing respectively between the alignment mark 16 and the circuit layer 14, the first alignment mark 26 and the circuit layer 24, the second alignment mark 36 and the circuit layer 34.

When the substrate 10, the first substrate 20 and the second substrate 30 are aligned by using rivet and the alignment mark 16, the first alignment mark 26 and the second alignment mark 36 (the circle area as shown in FIG. 1B), the alignment error caused by the alignment marks described above will be continuously accumulated. If the number of the circuit layers of the circuit board increases, the accumulated errors caused by the alignment marks on the substrates with circuit layers will increase accordingly.

In addition, as the number of circuit layers increases, the electric property (e.g. RC delay effect) of the circuit board will be deteriorated gradually, therefore the passive components must be added on the circuit board to improve the electric property of the circuit board. However, the normalized passive component with specific electric property is probably not fully conformed to the special circuit design, therefore the passive component can be embedded directly inside the circuit board. Thus the passive component embedded inside the circuit board can adjust the quality of the electric property of the circuit board, based on the wiring design and the choice of materials of the circuit board.

SUMMARY OF THE INVENTION

Considering this, the object of the present invention is to provide a fabrication process of a circuit board with embedded passive component to increase the alignment accuracy of the multi-layer circuit board.

Moreover, another object of the present invention is to provide a fabrication process of a circuit board with embedded passive component to avoid the passive component damage caused by the acid etchant, hence increases the process yield of the embedded passive component.

In addition, another object of the present invention is to provide a fabrication process of the circuit board with embedded passive component to produce circuit boards with a higher planarity.

In addition, another object of the present invention is to provide a circuit board with embedded passive component, which provides a better yield and reliability.

Based on the objects described above and other objects, the present invention provides a fabrication process of a circuit board with embedded passive component, including the following steps: First, a conductive layer with a first surface and a corresponding second surface is provided, wherein the first surface has at least one component area, and the conductive layer further has a plurality of the first through holes which pass through the conductive layer. Next, at least one passive component material layer is formed on the component area of the first surface. Then, a circuit unit with a plurality of the second through holes corresponding to the locations of the first through holes respectively is provided. The conductive layer and the circuit unit are aligned through the first through holes and the second through holes. The first surface of the conductive layer faces one of the surfaces of the circuit unit, and the passive component material layer is between the circuit unit and the conductive layer. Next, the conductive layer is laminated to the circuit layer. Lastly, the conductive layer is patterned to form a first circuit layer.

The material of the above conductive layer can be copper.

The fabricating method of the above material layer can be screen printing.

The first circuit layer described above can further include a first electrode and a second electrode which are electrically insulated with each other. The first electrode and the second electrode are connected to the passive component material layer, respectively. The material for the passive component material layer can be resistance or inductance material.

After the step of forming the passive component material layer, at least a first electrode layer can be further formed on top of the passive component material layer and the component area. And, the first circuit layer can further include a first electrode and a second electrode, wherein the first electrode connects to the electrode layer, and at least part of the electrode layer and at least part of the second electrode layer overlaps each other. And, the material for the passive component material layer can be capacitor dielectric material. In addition, the fabricating method of the electrode layer can be screen printing.

The above circuit unit may include a second circuit layer which is located on the surface of the circuit unit. And, in the step of laminating the conductive layer to the circuit unit, a dielectric layer may be further provided, and the dielectric layer is located between the conductive layer and the circuit unit, and the conductive layer is laminated to the surface of the circuit unit via the dielectric layer. Moreover, the dielectric layer can be a prepreg.

Based on the above objects or other objects, the present invention provides a fabrication process of a circuit board with embedded passive component. The method includes the following steps: Firstly, a circuit unit with a conductive layer and at least a passive component material layer is provided, wherein the conductive layer is located on a surface of the circuit layer and covers the passive component material layer. In addition, the conductive layer includes at least a component area, and the passive component material layer is located on the component area of the conductive layer. And then, a patterned photoresist layer is formed on top of the conductive layer. Next, a first etching process and a second etching process are performed on the conductive layer to form a circuit layer, wherein the first etching process uses an acid etchant, while the second etching process uses an alkaline etchant.

The above acid etchant can be cupric chloride solution or ferric chloride solution.

The above alkaline etchant can be ammonia solution or ammonium chloride solution.

The material of the above conductive layer can be copper.

The above circuit layer may further include a first electrode and a second electrode electrically insulated from the first electrode, and the first electrode and the second electrode are connected to the passive component material layer. The material of the passive component material layer includes a resistor material. Moreover, the resistor material can be nickel phosphate.

The above circuit unit can further include at least an electrode layer located on the passive component material layer and the component area, and the circuit layer can further include a first electrode and a second electrode, wherein the first electrode is connected to the electrode layer, while at least a part of the electrode layer and at least a part of the second electrode overlap each other. And, the material of the passive component material layer includes a capacitor material. Moreover, the capacitor material can be barium titanate.

The above method of forming the patterned photoresist layer on the conductive layer can be as follows. Firstly, a photoresist layer is formed on the conductive layer. Then, the photoresist layer is subject to an exposure process and a development process. In addition, the method of forming a photoresist layer on the conductive layer can be coating photoresist liquid or adhering a dry film photoresist.

After the conductive layer is subject to the above first etching process and the second etching process, the patterned photoresist layer can be removed.

Based on the above object and other object, the present invention provides a fabrication process of the circuit board with embedded passive component, including the following steps. First, a circuit unit with a first conductive layer, a second conductive layer and at least one material layer of the passive component is provided, wherein the first conductive layer and the second conductive layer are located respectively on two opposite surfaces of the circuit unit. In addition, the second conductive layer having at least one component area covers the passive component material layer. The passive component material layer is located on the component area of the second conductive layer. Next, a first photoresist layer and a second photoresist layer are formed and cover over the first conductive layer and the second conductive layer, respectively. The first photoresist layer is patterned, and a first etching process is performed on the first conductive layer to form a first circuit layer. After this, the patterned first photoresist layer and the patterned second photoresist layer are removed. A third photoresist layer and a fourth photoresist layer are formed and respectively cover over the first circuit layer and the second conductive layer. Then, the fourth photoresist layer is patterned. Furthermore, a second etching process and the third etching process are performed on the second conductive layer to form a second circuit layer, wherein an acid etchant is used in the second etching process, while an alkaline etchant is used in the third etching process.

The above acid etchant can be cupric chloride solution or ferric chloride solution.

The above alkaline etchant can be ammonia solution or ammonium chloride solution.

The material of the above first conductive layer and the second conductive layer can be copper.

The above second circuit layer may further include a first electrode and a second electrode which is electrically insulated with the first electrode, and the first electrode and the second electrode are separately connected to the passive component material layer, and the material of the passive component material layer includes a resistor material. Moreover, the resistor material can be nickel phosphate.

The above circuit unit can further include at least an electrode layer located on the passive component material layer and the component area, and the second circuit layer can further include a first electrode and a second electrode, wherein the first electrode is connected to the electrode layer, while at least a part of the electrode layer and at least a part of the second electrode overlaps each other. And, the material of the passive component material layer includes a capacitor material. Moreover, the capacitor material can be barium titanate.

The above method of patterning the first photoresist layer and patterning the fourth photoresist layer can be an exposure process and a development process.

The above method of forming the first photoresist layer, the second photoresist layer, the third photoresist layer and the fourth photoresist layer can be coating liquid photoresist or adhering dry film photoresist.

After the second conductive layer is subject to the above second etching process and the third etching process, the patterned fourth photoresist layer and the patterned third photoresist layer can be removed.

Based on the above object or other objects, the present invention provides a fabrication process of the circuit board with embedded passive component, including the following steps. First, a conductive layer, a first dielectric layer, a second dielectric layer and a circuit unit are provided, wherein a passive component material layer has been formed on a part of the area of the conductive layer, while at least one through hole has been formed within the second dielectric layer. The conductive layer, the first dielectric layer and the second dielectric layer are laminated to a surface of the circuit unit, wherein the passive component material layer is embedded into the through hole of the second dielectric layer, while the first dielectric layer and the second dielectric layer are located between the conductive layer and the circuit unit. And, the first dielectric layer is located between the second dielectric layer and the circuit unit. Next, the conductive layer is patterned to form a circuit layer.

The above step of laminating the conductive layer, the first dielectric layer and the second dielectric layer to the surface of the circuit unit can be as follows. The conductive layer is coupled to the second dielectric layer with a rivet manner, wherein the passive component material layer is embedded in the through hole of the second dielectric layer. Then, the riveted conductive layer and the second dielectric layer are laminated to the surface of the circuit unit. However, the lamination of the conductive layer, the first dielectric layer and the second dielectric layer to the surface of the circuit unit can be, for example, riveted together by use of fixture all at once.

The above method of forming a through hole within the second dielectric layer can be laser drilling method, drilling method, punch drilling method or routing method.

The material of the above conductive layer can be copper.

The above circuit layer can include a first electrode and a second electrode which is insulated with each other, and the first electrode and the second electrode are separately connected to the passive component material layer. The material of the passive component material layer can be material for resistor or inductor.

Before laminating the conductive layer, the first dielectric layer and the second dielectric layer to the surface of the circuit unit, at least one electrode layer can be formed on the passive component material layer. And, after the conductive layer is patterned, the circuit layer can have a first electrode and a second electrode which is insulated with the first electrode. Wherein, the first electrode of the circuit layer is connected to the electrode layer, while the passive component material layer is located between the electrode layer and the second electrode. The material of the passive component material layer can be capacitor dielectric material.

The above first dielectric layer and the second dielectric layer can be prepreg.

Based on the above object or other objects, the present invention provides a circuit board with embedded passive component, wherein the circuit board includes a circuit unit, a first dielectric layer, a second dielectric layer, a passive component material layer and a circuit layer, wherein the first dielectric layer is located on the circuit unit. The second dielectric layer is located on the first dielectric layer, and the second dielectric layer has a through hole. The passive component material layer is embedded in the through hole of the second dielectric layer, and the circuit layer is located over the second dielectric layer and the passive component material layer.

The above circuit layer can include a first electrode and a second electrode insulated with the first electrode, both of which are connected to the passive component material layer, and the material of the passive component material layer can be material of capacitor, resistor or inductor. Moreover, the thickness of the second dielectric layer can be the same as the thickness of the passive component material layer.

The above circuit board with embedded passive component can further include an electrode layer which covers the passive component material layer and a part of the circuit layer. The circuit layer has a first electrode and a second electrode insulated with the first electrode. Wherein, the first electrode is connected to the electrode layer, and the passive component material layer is located between the electrode layer and the second electrode. Moreover, the total thickness of the passive component material layer and the electrode layer can equal to the thickness of the second dielectric layer. In addition, the electrode layer can be multi-layer or single-layer.

The above circuit unit can be multi-layer circuit unit or single-layer circuit unit.

The above passive component material layer can be single-layer or multi-layer.

The above first dielectric layer can be a fiber layer and two resin layers located respectively on two opposite surfaces of the fiber layer.

The above second dielectric layer can be a fiber layer and two resin layers located respectively on two facing surfaces of the fiber layer.

Based on the above descriptions, the present invention uses the through holes to align the first electrode and the second electrode during the screen printing. And, the present invention uses the through holes directly as the alignment marks to align layers during the layer lamination. As a result, the present invention can reduce the accumulation of the alignment errors caused by the alignment marks.

In addition, the present invention uses a two-step etching process to form the circuit layer contacting the passive component material layer. And the two-step etching process starts with the first etching process using acid etchant, then with the second etching process using the alkaline etchant. Therefore, the two-step etching process can avoid the passive component material layer being damaged by the acid etchant, thus the process yield of the embedded passive component can be increased.

In addition, the present invention uses the dielectric layer with through holes, therefore the passive component material layer will not be easily damaged during the laminating process, and therefore the yield and reliability of the products can be increased. Moreover, since the thickness of the dielectric layer with through holes is similar or the same with the passive component material layer (or the total thickness of the passive component material layer and the circuit layer), the circuit board of the present invention has a higher planarity.

These and other exemplary embodiments, features, aspects, and advantages of the present invention will be described and become more apparent from the detailed description of exemplary embodiments when read in conjunction with accompanying drawings.

BRIEF DESCRIPTION OF THE DRAWINGS

FIG. 2A to FIG. 2E illustrate cross-sectional views of the fabrication process of the circuit board with embedded passive component according to the embodiment of the present invention.

FIG. 6A to FIG. 6C illustrate the cross-sectional views of the fabrication process of the circuit board with embedded passive component according to the embodiment of the present invention.

FIG. 7A to FIG. 7E illustrate the cross-sectional views of the fabrication process of the circuit board with embedded passive component according to another embodiment of the present invention.

Figure 9:
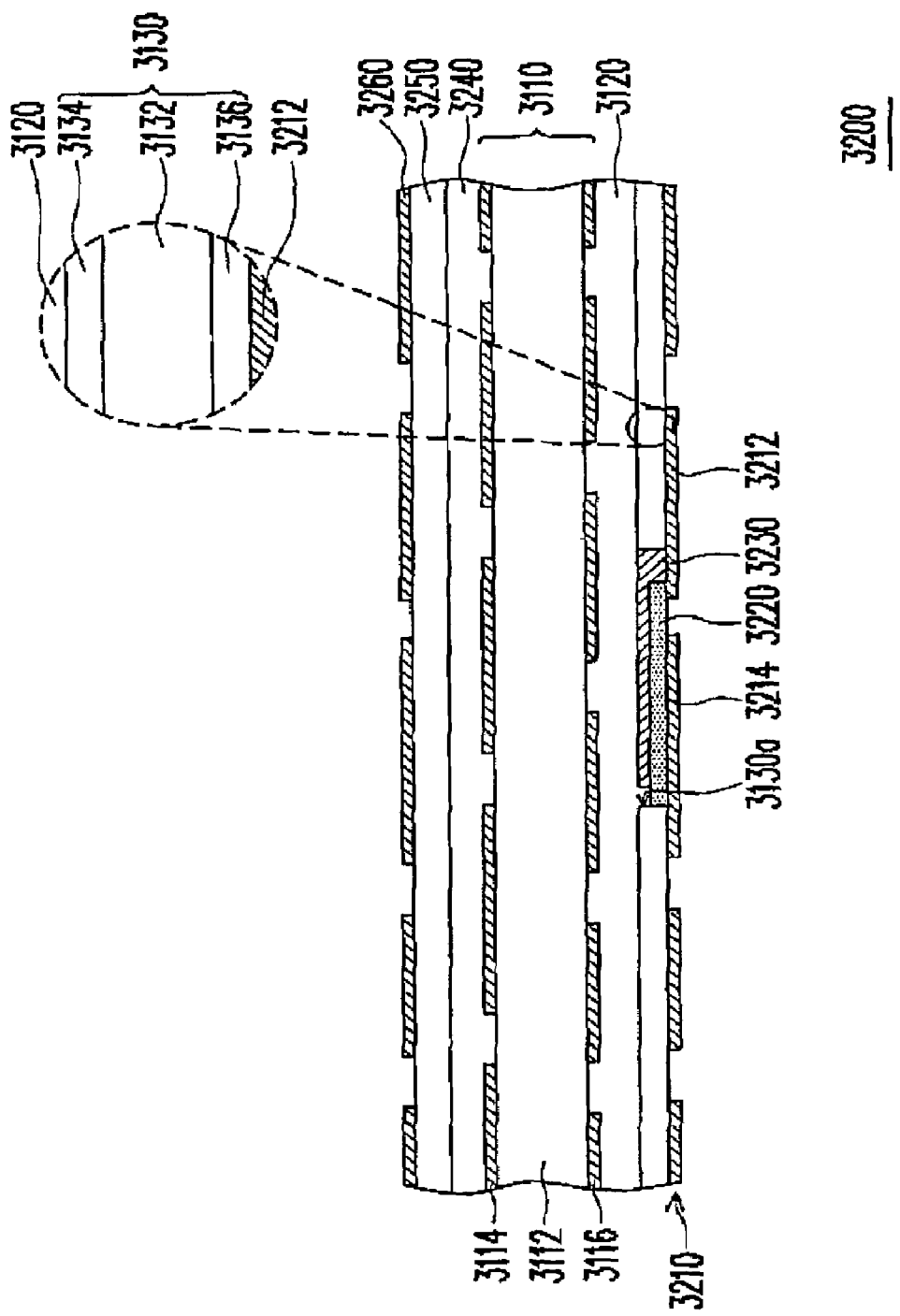

The FIG. 9 illustrates the cross-sectional view of the circuit board with embedded passive component according to another embodiment of the present invention.

DESCRIPTION OF THE PREFERRED EMBODIMENTS

Figure 2C:
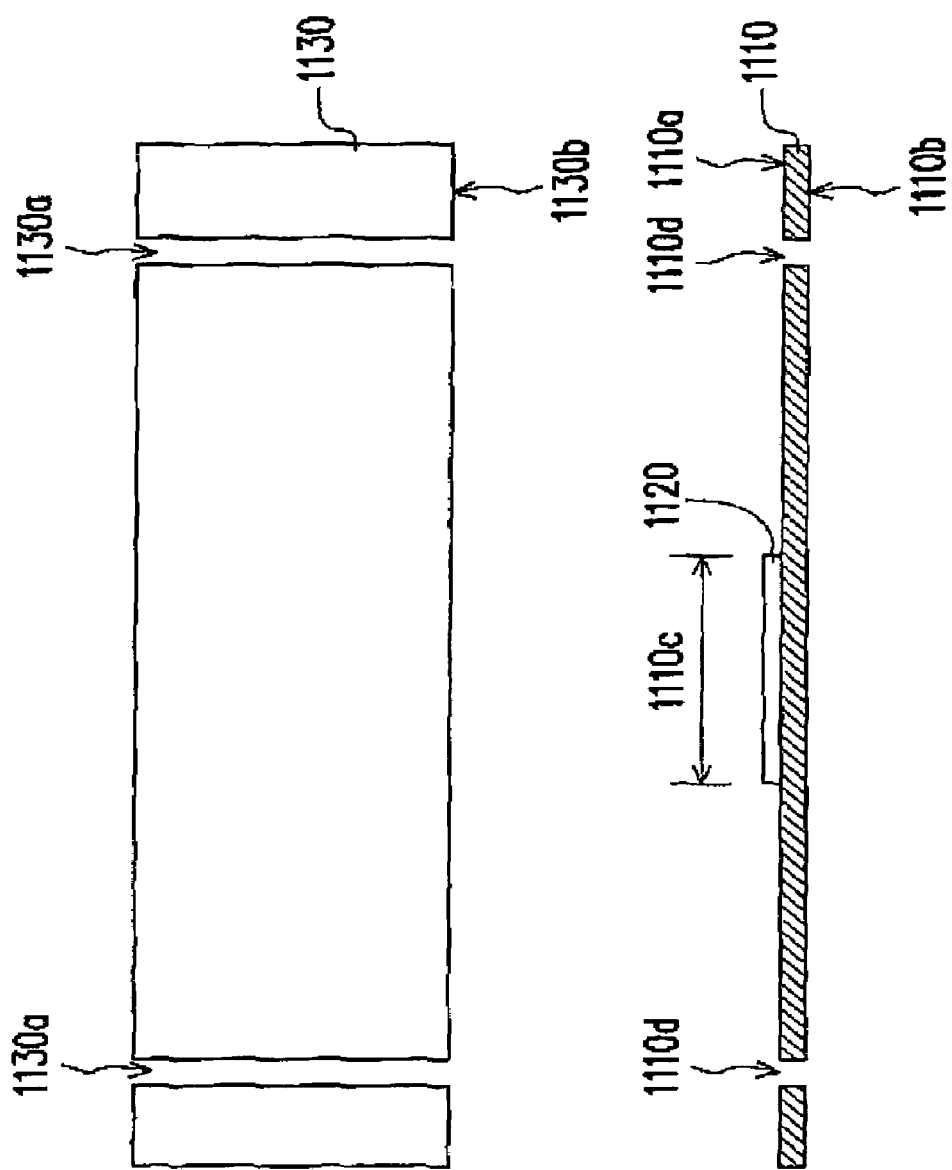

FIG. 2A to FIG. 2E illustrate cross-sectional views of the fabrication process of the circuit board with embedded passive component according to the embodiment of the present invention. With reference to the FIG. 2A to FIG. 2E, the fabrication process of the circuit board of the present embodiment includes the following steps. First, a conductive layer 1110 with a plurality of through holes 1110d, a first surface 1110a and a corresponding second surface 1110b is provided. Wherein, the first surface 1110a has at least a component area 1110c and the through holes 1110d respectively pass through the conductive layer 1110. Next, at least one passive component material layer 1120 is formed on the component area 1110c of the first surface 1110a (as shown in FIG. 2B). Then, a circuit unit 1130 (as shown in FIG. 2C) with a plurality of through holes 1130a is provided. The locations of these through holes 1130a correspond to the locations of the through holes 1110d.

Figure 2D:
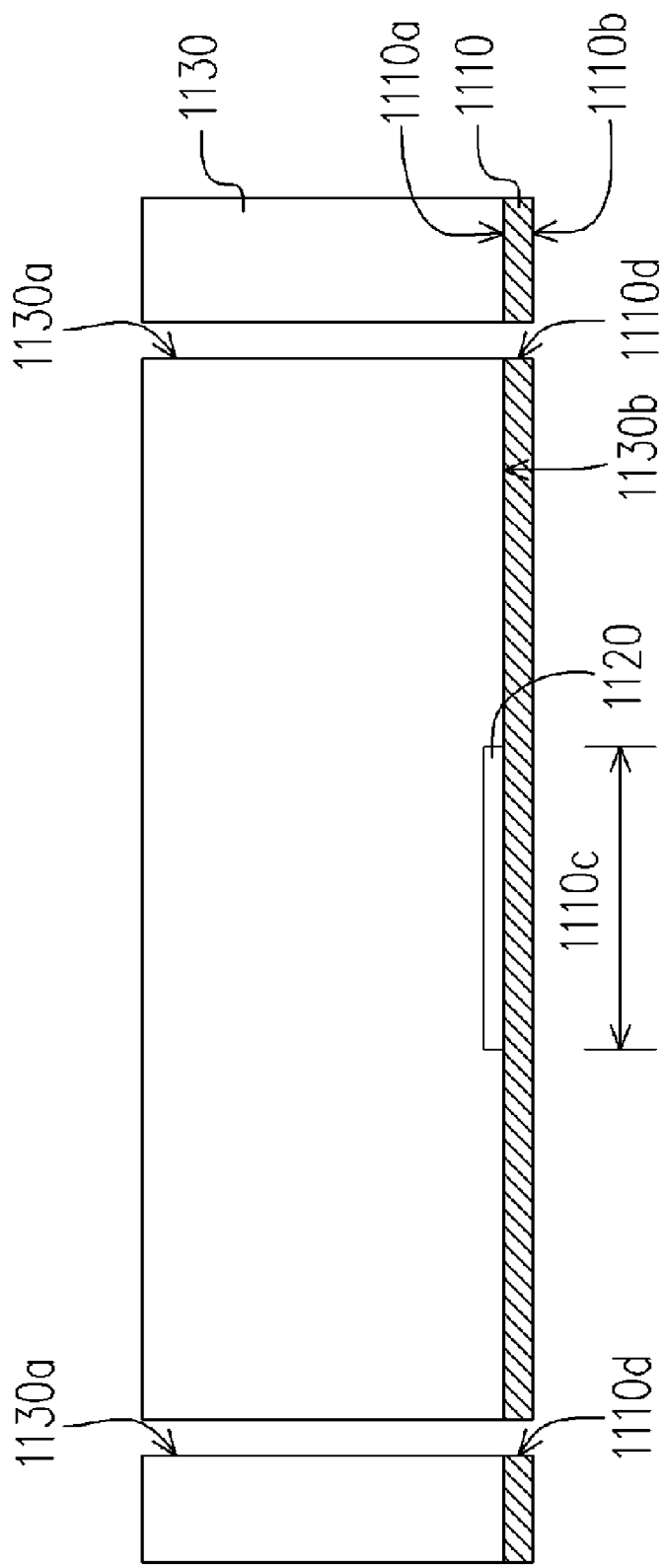

Remarkably, the present embodiment aligns the relative location between the conductive layer 1110 and the circuit unit 1130 by the through holes 1110d and 1130a. In addition, the first surface 1110a of the conductive layer 1110 faces a surface 1130b of the circuit unit 1130, and the passive component material layer 1120 is located between the circuit units 1130. Then, the conductive layer 1110 is laminated to the circuit unit 1130 (as shown in FIG. 2D). At last, the conductive layer 1110 is patterned to form a circuit layer 1112 (as shown in FIG. 2E).

Figure 1A:
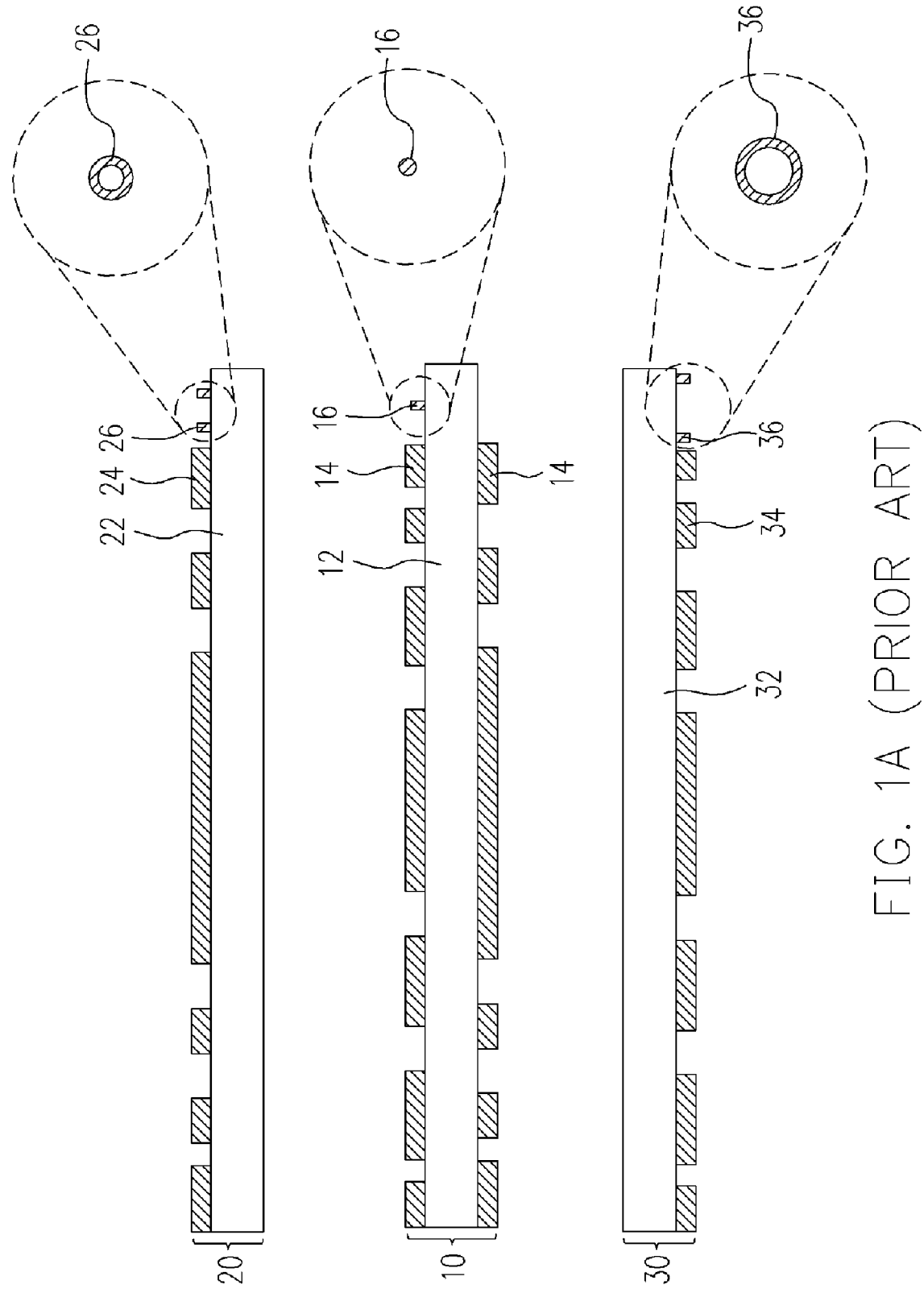
FIG. 1A and FIG. 1B illustrate cross-sectional views of the fabrication process of the conventional multi-layer printed circuit board.
Figure 1B:
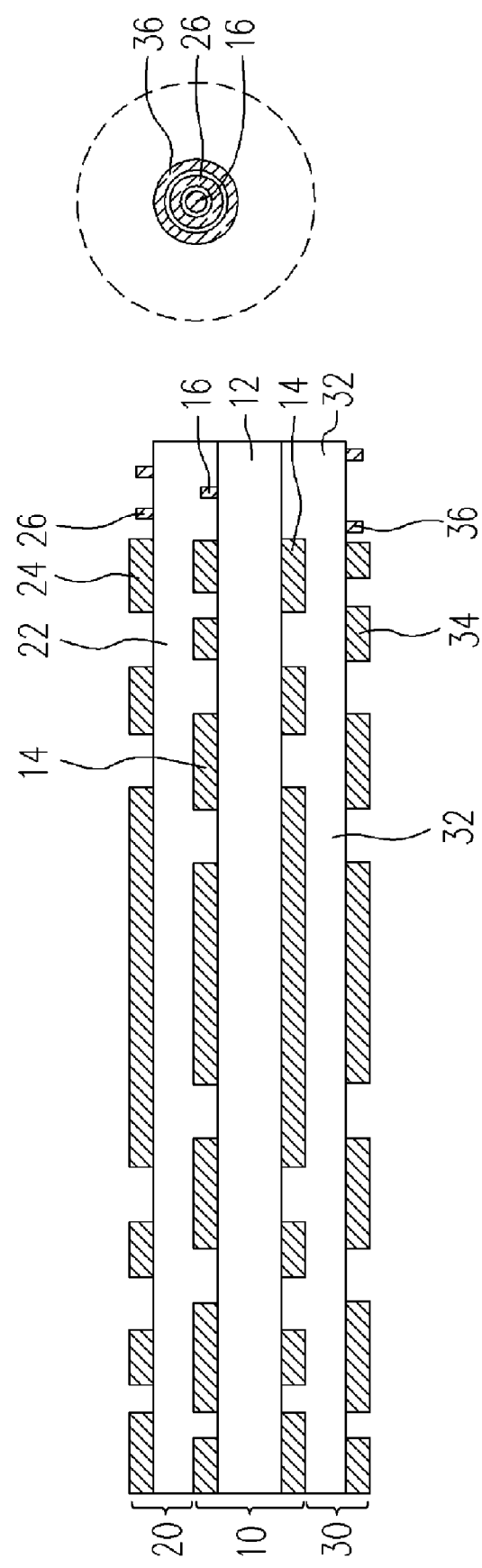
Figure 2E:
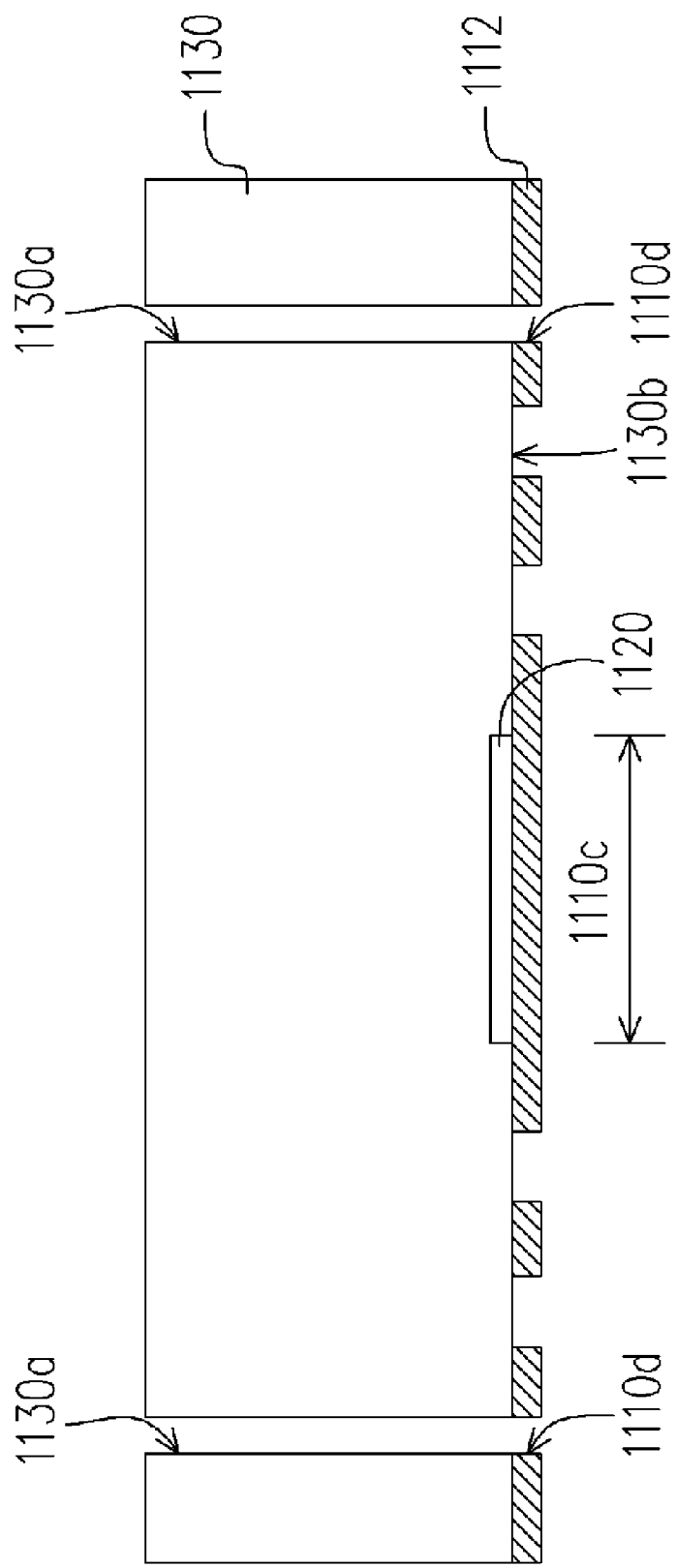

Still with reference to the FIG. 2E, the method of aligning the through holes 1110d and 1130a can use X-ray or other image positioning system. Comparing with the alignment marks (as shown in FIG. 1B) using the conventional technology, the present embodiment aligns the conductive layer 1110 and circuit unit 1130 directly by the through holes 1110d and 1130a, this results in a reduced accumulation of alignment errors. Moreover, the conductive layer 1110 can be a copper foil layer or other conductive material layer, and the component area 1110c can be the passive component collocation area.

Remarkably, the method of forming a passive component material layer can be screen printing. In addition, the circuit unit 1130 can be the semi-finished product of the multi-layer printed circuit board. Moreover, the method for forming the through holes 1110d's can be mechanical drilling or laser drilling. After the through holes 1110d are formed, the through holes 1110d are used as the alignment holes during the forming process of the passive component material layer. Furthermore, the through holes 1130a had been formed in the circuit unit 1130 before laminating and aligning process. Meanwhile, an electroplating metal layer (not shown) can be further formed, so that the through holes 1130a are able to electrically connect to at least two circuit layers (not shown) within the circuit unit 1130.

Figure 3:
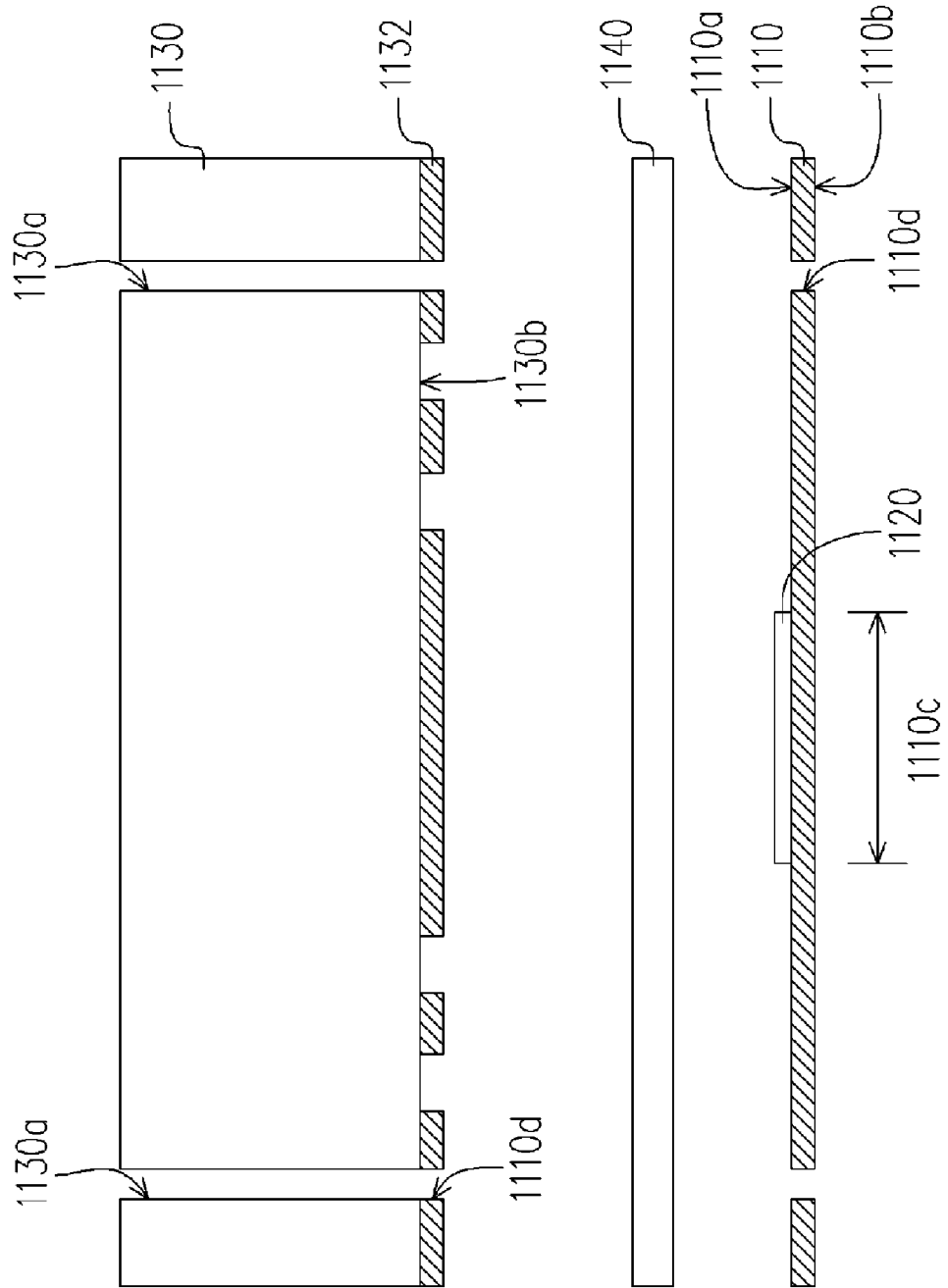
FIG. 3 illustrates a cross-sectional view of the fabrication process of the circuit board with embedded passive component according to the embodiment of the present invention.

The FIG. 3 illustrates a cross-sectional view of the fabrication process of the circuit board with embedded passive component according to the embodiment of the present invention. With reference to the FIG. 3, the content of FIG. 3 is similar to the content of the FIG. 2C, while the difference is that the circuit unit 1130 in FIG. 3 can include a circuit layer 1132 which is located on the surface 1130b of the circuit unit 1130. Moreover, in the step of laminating the conductive layer 1110 to the circuit unit 1130, a dielectric layer 1140 located between the conductive layer 1110 and the circuit unit 1130 can be further provided. Then, the conductive layer 1110 is laminated to the surface 1130b of the circuit unit 1130 via the dielectric layer 1140. Remarkably, in the laminating step, the through holes 1110d and the opposite through holes 1130a are also used in the present embodiment to align the relative location between the conductive layer 1110 and the circuit unit 1130. In addition, the component area 1110c of FIG. 3 and FIG. 2C can be component area for resistor, inductance or capacitor, which will be described below respectively.

Figure 4:
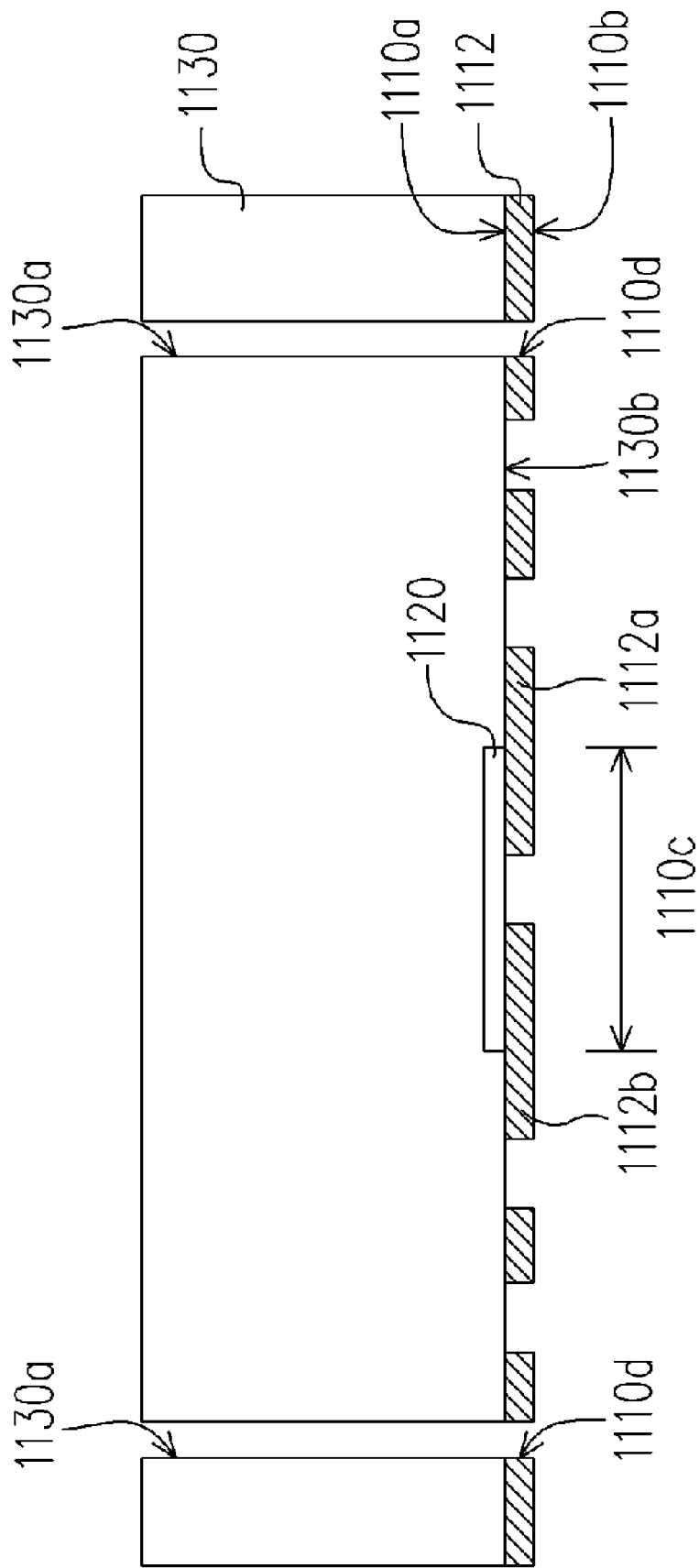
FIG. 4 illustrates the cross-sectional view of applying the fabrication process of the circuit board with embedded passive component to the resistor component according to the embodiment of the present invention.

FIG. 4 illustrates the cross-sectional view of applying the fabrication process of the circuit board with embedded passive component to resistor component according to an embodiment of the present invention. With reference to the FIG. 4, the content of FIG. 4 is similar to the content of the FIG. 2E, while the difference is the circuit layer 1112 of FIG. 4 further including an electrode 1112a and an electrode 1112b which is insulated with the electrode 1112a. The electrode 1112a and electrode 1112b are connected to the passive component material layer 1120 respectively. In addition, the material of the passive component material layer 1120 can be resistor material. Therefore, the electrodes 1112a and 1112b together with the passive component material layer 1120 can form a resistor component. In the same principle, an inductor component can be formed when the material of the passive component material layer 1120 is the inductor material.

Figure 5A:
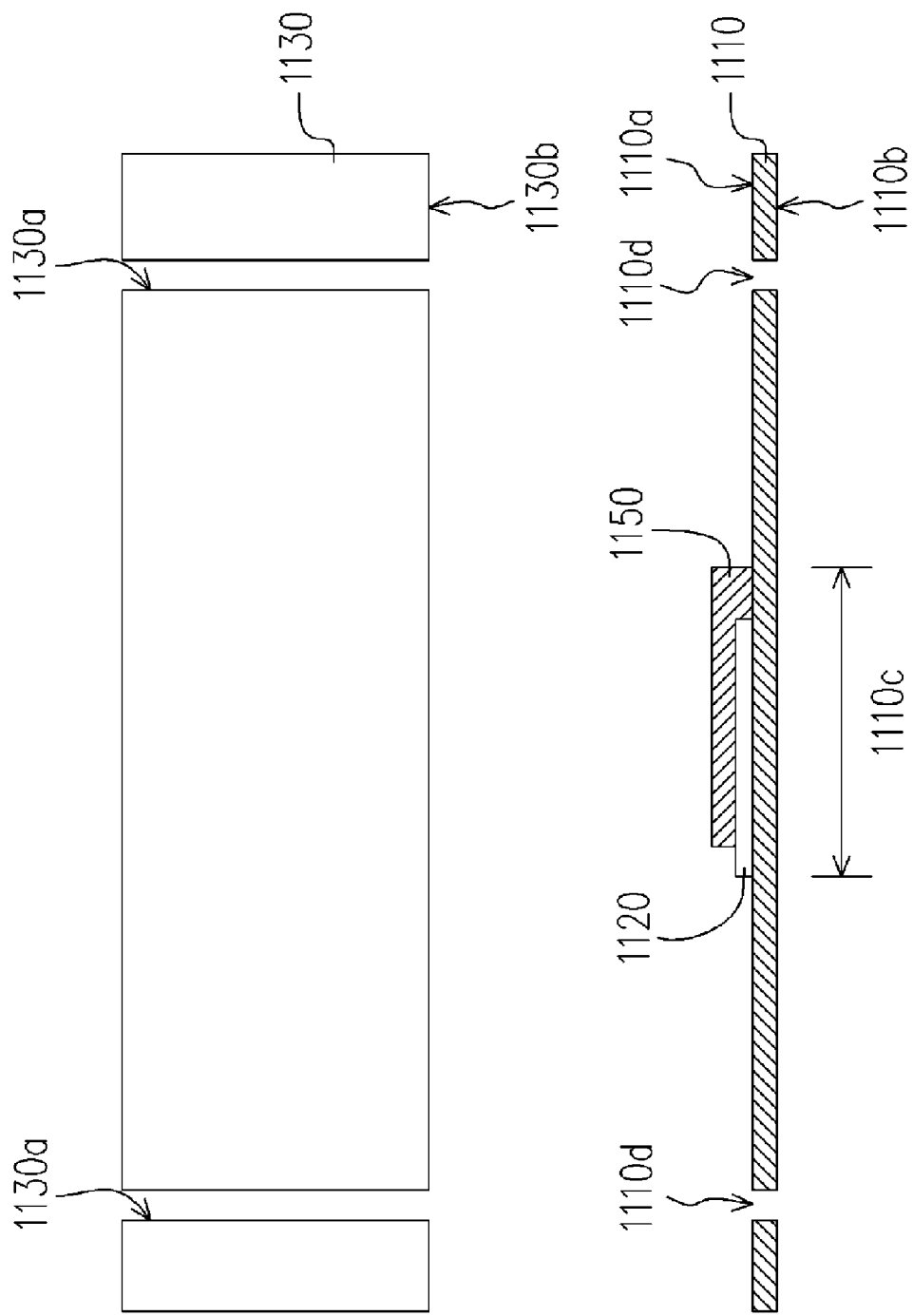
FIG. 5A to FIG. 5B illustrate cross-sectional views of applying the fabrication process of the circuit board with embedded passive component to the capacitor component according to the embodiment of the present invention.
Figure 5B:
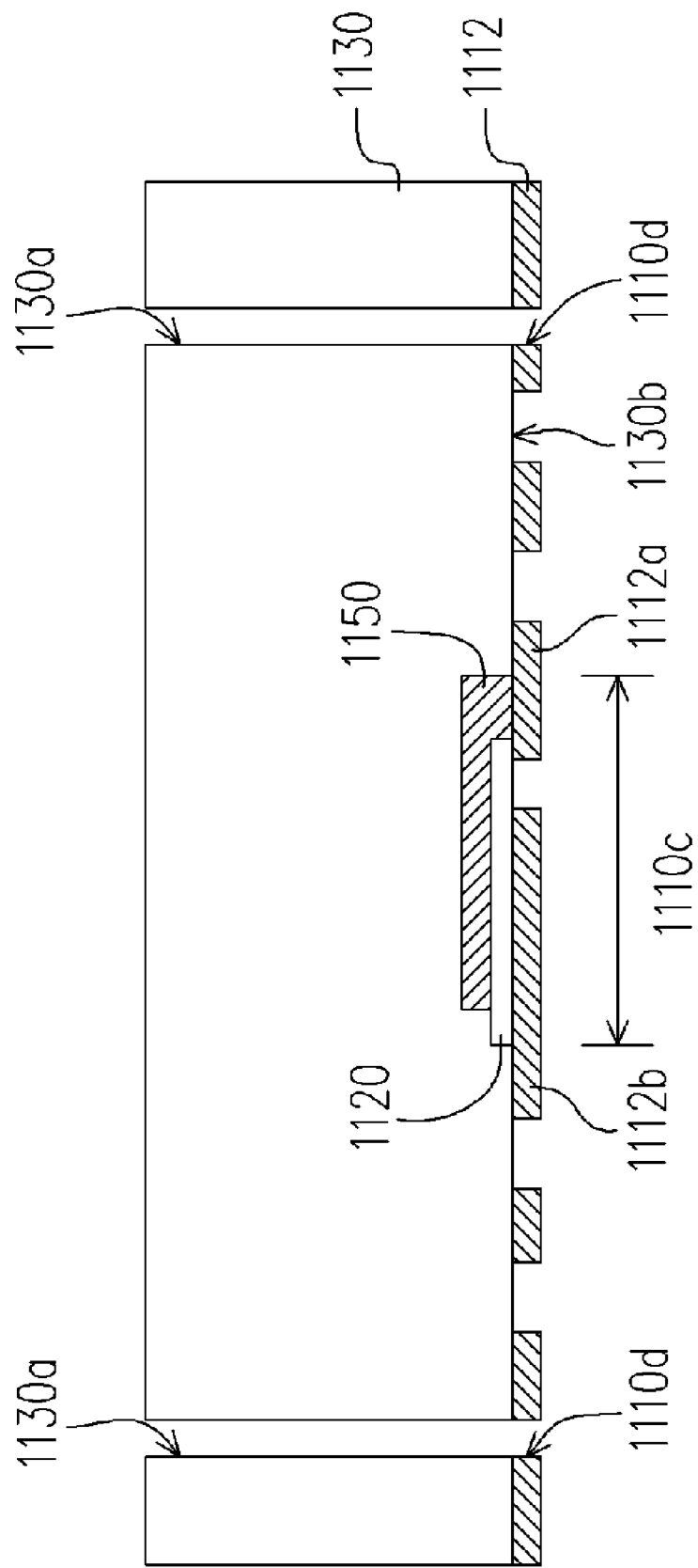

The FIG. 5A to FIG. 5B illustrate cross-sectional views of applying the fabrication process of the circuit board with embedded passive component to capacitor component according to the embodiment of the present invention. With reference to the FIG. 5A, the present embodiment is similar to the above embodiment, while the difference is that after the passive component material layer 1120 being formed, at least one electrode layer 1150 can be further formed on the passive component material layer 1120 and the component area 1110c (as shown in FIG. 5A).

With reference to the FIG. 5B, the circuit layer 1112 can further include an electrode 1112a and an electrode 1112b, wherein the electrode 1112a is connected to the electrode layer 1150, and at least a part of the electrode layer 1150 and at least a part of the electrode 1112b overlap each other to form an effective capacitor area. And, the material of the passive component material layer 1120 can be dielectric material. In addition, the method of forming the electrode layer 1150 can be screen printing. And, the through holes 1110d can be used as the alignment holes for the screen printing when forming the electrode layer 1150. Therefore, an electrode layer 1150, an electrode 1112a, an electrode 1112b and the passive component material layer 1120 can form a capacitor component.

Comparing with the alignment marks using the conventional technology, the present embodiment uses the through holes on the layers directly serving as the alignment marks of the layers, this results in a reduced accumulation of alignment errors. Moreover, the present invention can further form an embedded resistor component, an inductor component or a capacitor component to comply with the circuit design of the circuit board. In addition, among the embedded resistor component, the inductor component or the capacitor component, the method of forming the passive component material layer of resistor component, inductor component or capacitor component can be screen printing, drill (the first through holes)-and-print method, that is, the holes have been drilled before the screen printing. The through holes can serve as the alignment holes of the layers in screen printing. As a result, the present invention can reduce the accumulation of alignment errors in screen printing, thus the fabricating cost will be reduced.

Figure 6B:
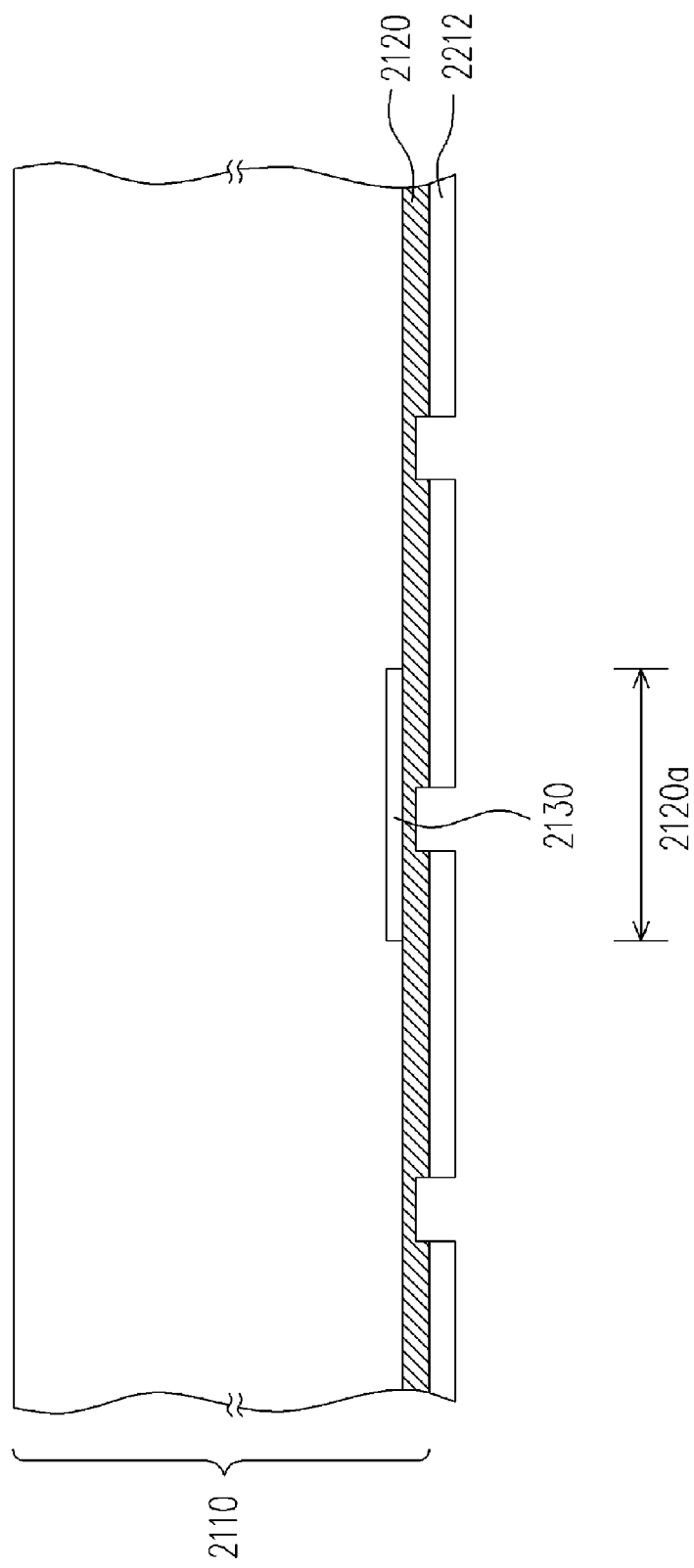
Figure 6C:
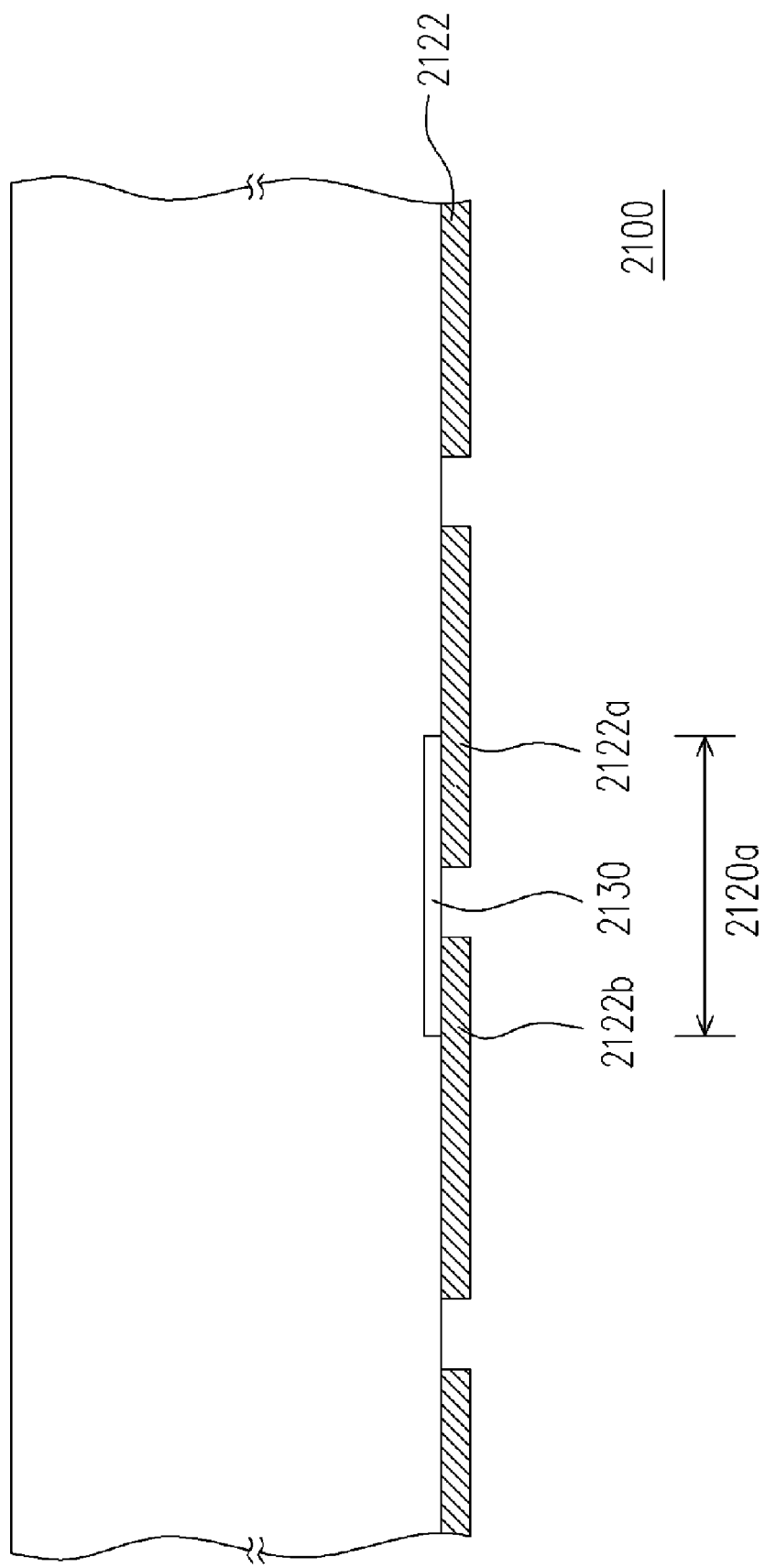

The FIG. 6A to FIG. 6C illustrate cross-sectional views of the fabrication process of the circuit board with embedded passive component according to the embodiment of the present invention. With reference to the FIG. 6A, the fabrication process of the circuit board with embedded passive component, for example, includes following steps. First, a circuit unit 2110 with a conductive layer 2120 and at least one passive component material layer 2130 is provided, wherein the conductive layer 2120 is located on a surface of the circuit unit 2110, and the passive component material layer 2130 is covered by conductive layer 2120. Moreover, the conductive layer 2120 includes at least a component area 2120a on which the passive component material layer 2130 is located. In addition, the material of the conductive layer 2120 for example includes copper or other material with good conductivity.

Still referring to FIG. 6A, a photoresist layer 2210 is formed on the conductive layer 2120, and the method of forming the photoresist layer can be, for example, adhering dry film or coating liquid photoresist. Referring to FIG. 6B, the photoresist layer 2210 is subjected to an exposure process and a development process to form a patterned photoresist layer 2212. Next, the conductive layer 2120 is subjected to a first etching process and a second etching process to form a circuit layer 2122 (as shown in FIG. 6C). Moreover, the first etching process uses the acid etchant which for example includes cupric chloride, ferric chloride solution or other appropriate acid etchant. Especially remarkably, the conductive layer 2120 is not fully etched by the first etching process to form the circuit layer 2122 (as shown in FIG. 6B), instead, only a part of the conductive layer 2120 is removed by the first etching process.

With reference to the FIG. 6C, the structure formed by the above process is subsequently subjected to a second etching process wherein an alkaline etchant is used to form the circuit layer 2122. The alkaline etchant for example includes ammonia solution, ammonium chloride solution or other appropriate alkaline etchant. Next, the patterned photoresist layer 2212 (as shown in FIG. 6B) is removed to fully expose the circuit layer 2122, and to form a circuit board 2100 with embedded passive component (as shown in the FIG. 6C). In addition, the circuit layer 2122 for example further includes an electrode 2122a and an electrode 2122b which is insulated with the electrode 2122a. Electrode 2122a and 2122b are respectively connected to the passive component material layer 2130, and the material of the passive component material layer 2130 for example can include resistor material. In addition, the resistor material, for example, includes nickel phosphate or other resistor material that can be corroded by acid etchant.

Remarkably, in the case that the material of the conductive layer 2120 (as shown in FIG. 6B) is copper, since the acid etchant will cause an obvious undercut to the conductive layer 2120 formed of copper, and will also corrode the passive component material 2130 (e.g. nickel phosphate resistor material), therefore, it's better to etch most of the conductive layer 2120 (as shown in FIG. 6B) through the first etching process, and then etch out the circuit layer 2122 through the second etching process. Thus, the undercut to the conductive layer 2120 can be reduced, and the corrosion to the passive component material layer can be avoided. In other words, the fabrication method of any metal circuit contacting the passive component material layer uses the two-step etching process (applying the acid etchant process first, then applying the alkaline etchant process), to improve the process yield of the embedded passive component. Remarkably, the circuit unit 2110 is not limited to a single-layer circuit board. The circuit unit 2110 can also be a multi-layer circuit board. In addition, the passive component material layer 2130 is not limited to the resistor material; the passive component material layer 2130 can be capacitor material or inductor material as well, this will be described later.

FIG. 7A to FIG. 7E illustrate cross-sectional views of the fabrication process of the circuit board with embedded passive component according to another embodiment of the present invention. With reference to the FIG. 7A, the difference between the present embodiment and the above embodiment is that the circuit unit 2310 is a multi-layer circuit board, and the material of the passive component material layer 2340 is capacitor material, for example including barium titanate or other capacitor material that can be etched by acid etchant. The circuit unit 2310 has a conductive layer 2320, a conductive layer 2330, at least one passive component material layer 2340 and at least one electrode layer 2350, wherein the conductive layers 2320 and 2330 are respectively located on two opposite surfaces of circuit unit 2310. In addition, the conductive layer 2330 covers the passive component material layer 2340 and the electrode layer 2350, and the conductive layer 2330 includes at least one component area 2330a, wherein the passive component material layer 2340 is located on the component area 2330a of the conductive layer 2330, and the electrode layer 2350 covers the passive component material layer 2340 and the component area 2330a.

Figure 7D:
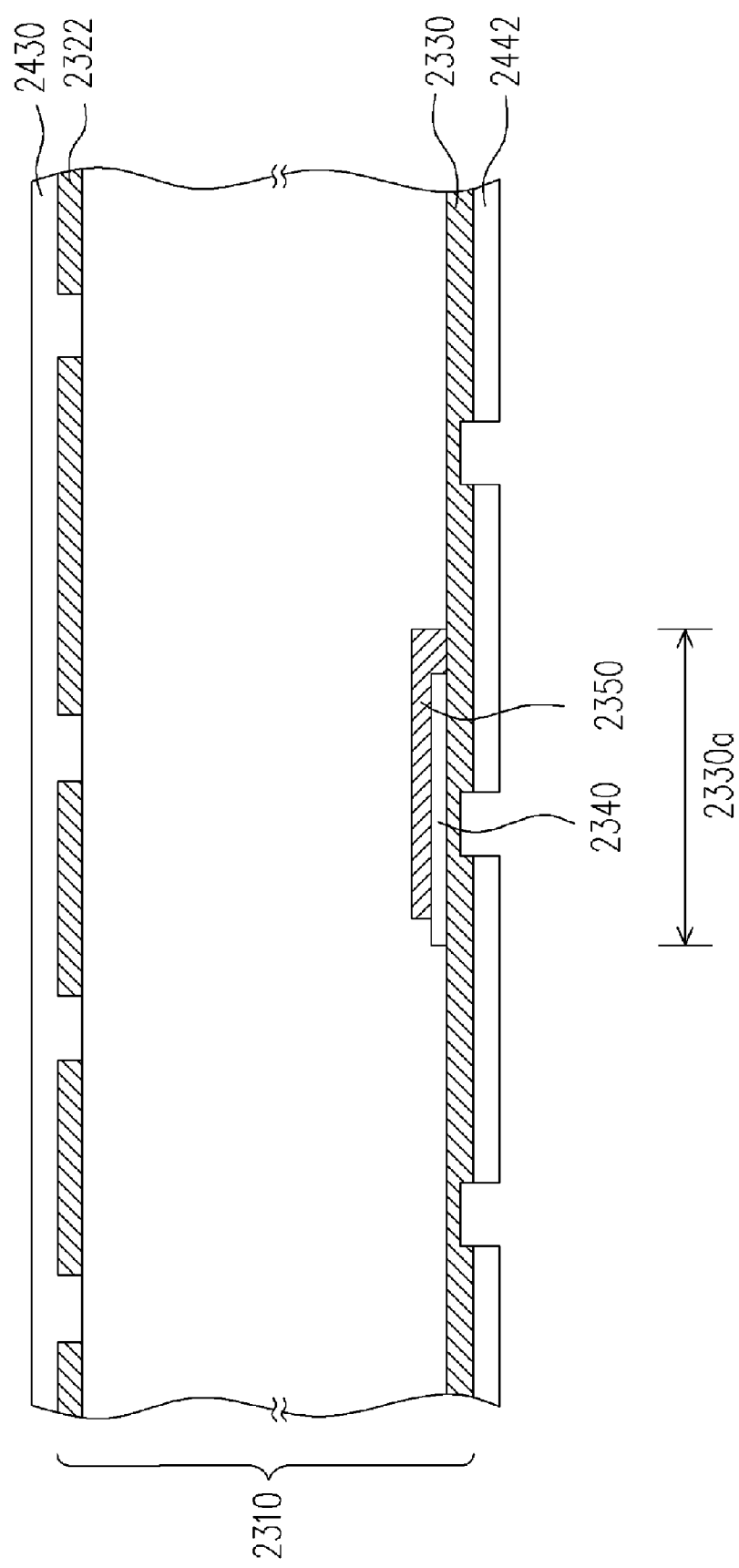

Still with reference to FIG. 7A, a photoresist layer 2410 is formed on conductive layer 2320, and a photoresist layer 2420 is formed on conductive layer 2330, wherein the photoresist layer 2410 and the photoresist layer 2420 are, for example, formed by adhering dry film or coating liquid photoresist. With reference to FIG. 7B, the photoresist layer 2410 is subjected to an exposure process and a development process to form a patterned photoresist layer 2412. Next, the conductive layer 2320 is etched by the first etching process to form a circuit layer 2322. And then, the patterned photoresist layer 2412 and photoresist layer 2420 are removed. With reference to FIG. 7C, a photoresist layer 2430 is formed for covering the circuit layer 2322 and a photoresist layer 2440 is formed for covering conductive layer 2330. The photoresist layer 2430 can avoid the damage caused by the subsequent etching process. The method of forming the photoresist layers 2430 and 2440, for example can be adhering dry film or coating liquid photoresist. Further next, the photoresist layer 2440 is subjected to a patterned process (e.g. exposure and development) to form a patterned photoresist layer 2442 (as shown in FIG. 7D).

Figure 7E:
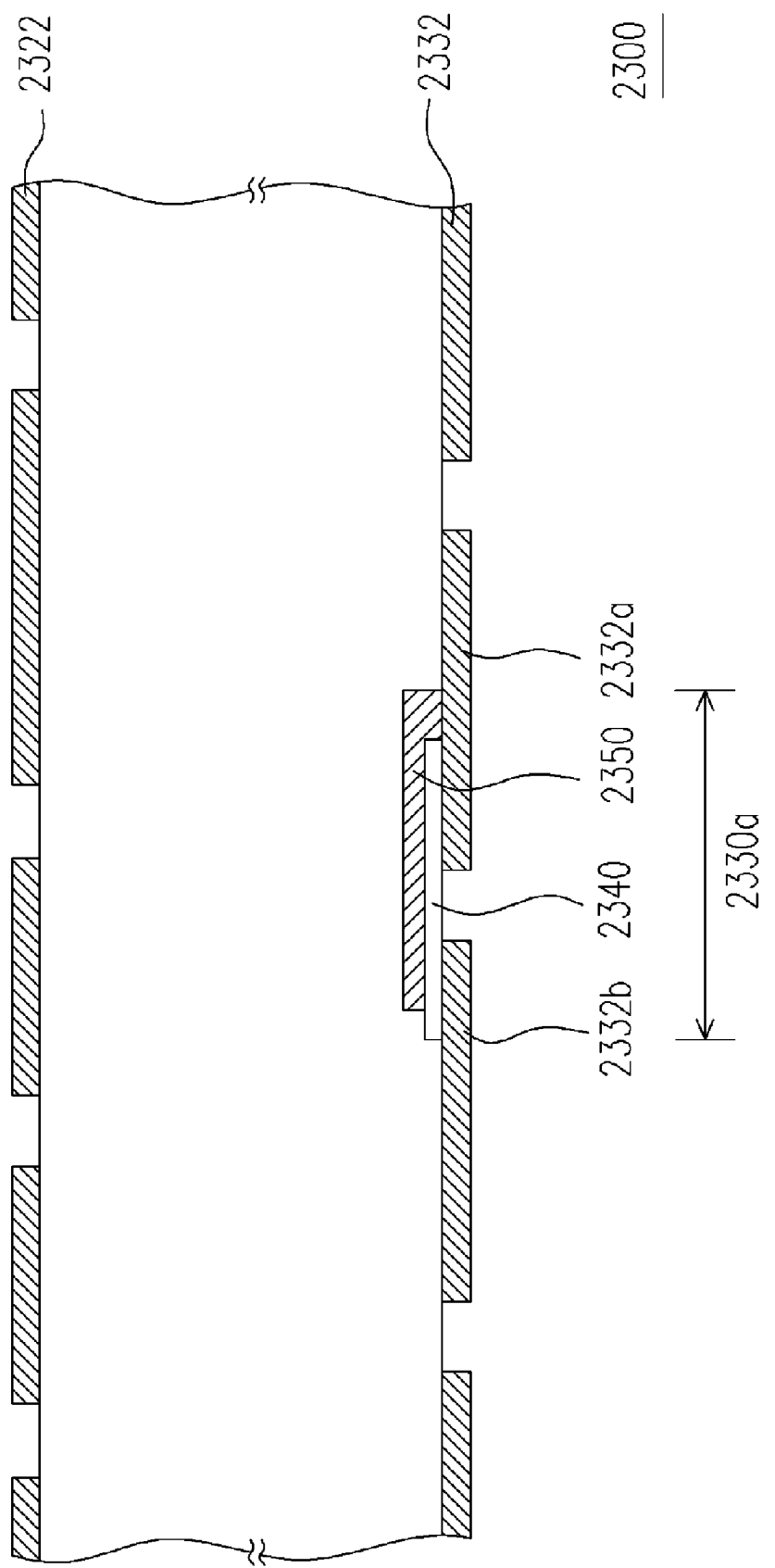

Still with reference to FIG. 7D, the conductive layer 2330 is first etched by the second etching process, and the acid etchant (e.g. includes cupric chloride solution, ferric chloride solution or other appropriate acid etchant) is used in the second etching process to etch most part of the conductive layer 2330. However, the second etching process using acid etchant does not etch out the metal circuit from the conductive layer 2330. With reference to FIG. 7E, the structure formed through the above process is subjected to a third etching process so that a circuit layer 2332 is formed out of the conductive layer 2330, wherein the third etching process uses alkaline etchant (e.g. Ammonia solution, ammonium chloride solutions or other appropriate alkaline etchant). Further next, the photoresist layer 2430 and patterned photoresist layer 2442 are removed (as shown in FIG. 7D) to form a circuit board 2300 (as shown in FIG. 7E) with embedded passive component. Moreover, the circuit layer 2332 includes electrodes 2332a and 2332b, wherein the electrode 2332a is connected to the electrode layer 2350, and at least a part of the electrode layer 2350 and at least a part of the electrode 2332b overlaps to form an embedded capacitor component.

Based on the above description, since the passive component material layer 2340 (e.g. barium titanate dielectric material) is easily damaged by acid etchant, the second conductive layer 2330 is etched by two-step etching process (acid etchant etching process first, alkaline etchant etching process second.) to form a circuit layer 2332. This not only results in avoiding the damage to the passive component material layer 2340, but also results in improving the electric quality of the circuit board 2300. The conventional circuit board fabrication technology patterns the conductive layers 2320 and 2330 simultaneously, as a result, the passive component material layer 2340 could be easily damaged. Therefore, in the embodiment of the present invention, the conductive layer 2320 is patterned first (without contacting the passive component material layer 2340), and then the conductive layer 2330 is patterned (with contacting the passive component material layer 2340), so as to increase the quality of the embedded passive component.

Remarkably, the fabrication process of the present invention is not limited to the structure illustrated in FIG. 6A and FIG. 7A. All the circuit layers contacting the passive component material layer 2130 or 2340 can be applied the acid etchant etching process first, then applied the alkaline etchant etching process, so as to increase the process yield of the embedded passive component. Moreover, the present invention is not limited to be applied in fabricating the embedded resistor component or embedded capacitor component, but also can be applied in fabricating embedded inductor component.

Comparing with the conventional fabrication process, the present invention uses the two-step etching process which etches with acid etchant first and then etches with alkaline etchant, to form the circuit layer contacting the passive component material layer, therefore, the passive component material layer will not be damaged by the acid etchant, thus the process yield of the embedded passive component will be increased.

In addition, the present invention adopts the two-step etching process which etches with acid etchant first and then etches with alkaline etchant. The result is that the required circuit layers can be fabricated, and the damage to the passive component material layers can be avoided.

In addition, the present invention uses two-step etching process which patterns the conductive layer which does not contact the passive component material first, and then etches the conductive layer which contacts the passive component material layer. This can improve the prevention on the passive component material from being damaged by the acid etchant.

Figure 8A:
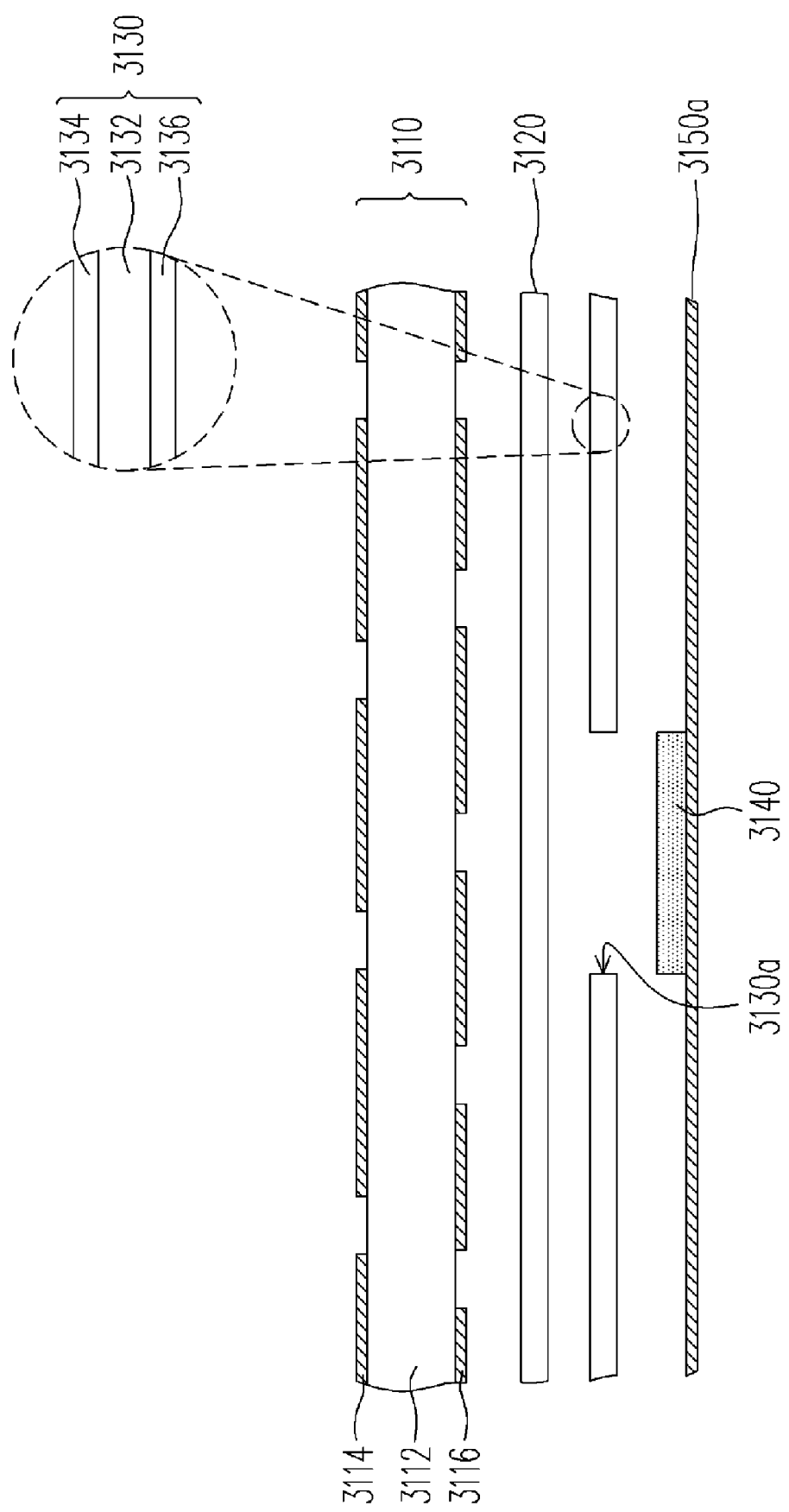
FIG. 8A to FIG. 8C illustrate the cross-sectional views of the fabrication process of the circuit board with embedded passive component according to an embodiment of the present invention.
Figure 8B:
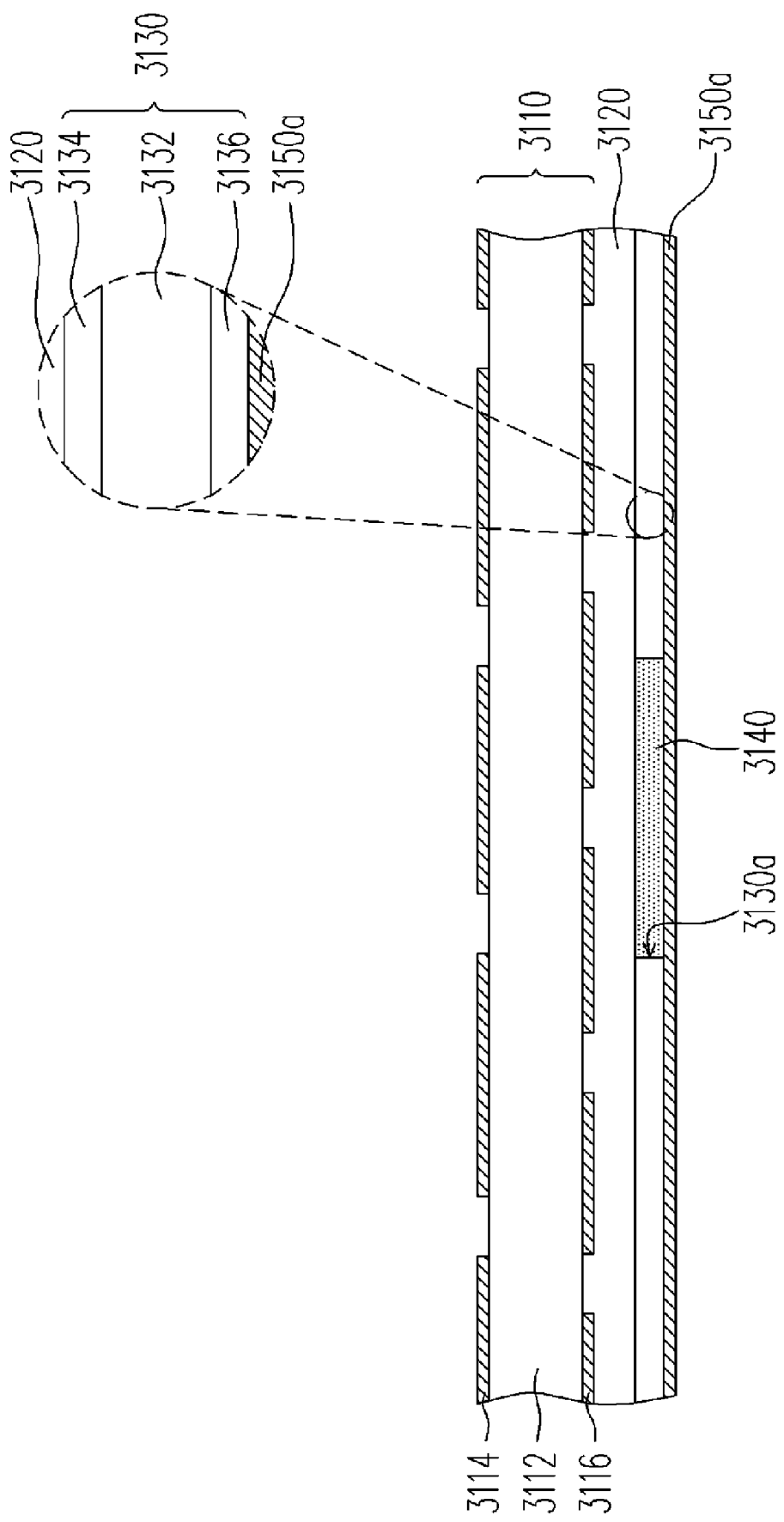
Figure 8C:
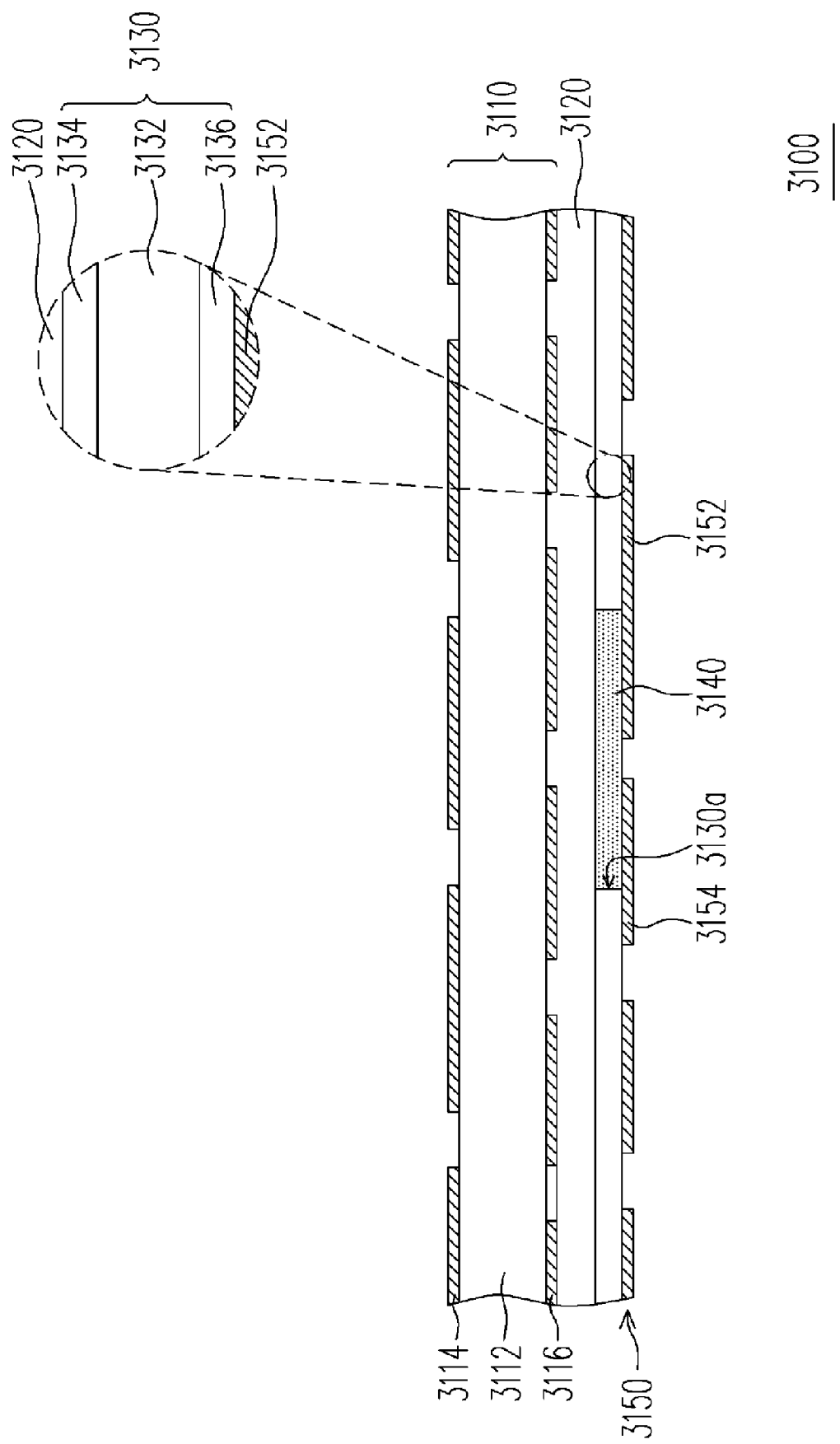

FIG. 8A to FIG. 8C illustrate cross-sectional views of the fabrication process of the circuit board with embedded passive component according to an embodiment of the present invention. With reference to the FIG. 8A, the fabrication process of the circuit board of the present embodiment includes the following steps. First, a circuit unit 3110, a dielectric layer 3130, 3120 and a conductive layer 3150a are provided, wherein the conductive layer 3150a, for example is copper foil layer or other conductive material layer, and a passive component material layer 3140 has been formed on a part of the area of the conductive layer 3150a. Moreover, the passive component material layer 3140 can be a single-layer structure or a multi-layer structure. In addition, the material of the passive component material layer 3140 can be resistor or inductor material, but material of the passive component material layer 3140 can also be dielectric material (to be described in detail later).

Moreover, at least a through hole 3130a has been formed in the dielectric layer 3130, and its fabrication method can be, for example, laser drilling, drilling, punch drilling, routing or other appropriate process. More specifically, the dielectric layers 3130 and 3120, for example can be a prepreg or other appropriate material. In addition, the dielectric layer 3130, for example is a fiber layer 3132 and the resin layers 3134 and 3136 (as shown in the dotted line area) which are located on two opposite surfaces of the fiber layer 3132.

With reference to FIG. 8B, the conductive layer 3150a, dielectric layer 3120 and 3130 are laminated to the surface of the circuit unit 3110, wherein the passive component material layer 3140 is embedded in the through holes 3130a of the dielectric layer 3130, and dielectric layer 3120 is located between the dielectric layer 3130 and the circuit layer 3110. In the present embodiment, the conductive layer 3150a, dielectric layer 3120 and 3130 are laminated to the circuit unit 3110 at the same time. In another embodiment, the conductive layer 3150a and the dielectric layer 3130 are riveted together first, then the riveted conductive layer 3150a, dielectric layer 3130 and dielectric layer 3120 are laminated to the surface of the circuit unit 3130. It can be known from above descriptions, the present embodiment is not limited to the sequence of laminating the dielectric layer 3130, dielectric layer 3120 and conductive layer 3150a to the circuit unit 3110, or the above materials being riveted together simultaneously. Remarkably, since the dielectric layer 3130 includes through holes 3130a, thus the passive component material layer 3140 will not be easily damaged during the lamination process.

With reference to FIG. 8C, the conductive layer 3150a is patterned to form a circuit layer 3150, thus the circuit board 3100 with embedded passive component is finally fabricated. More specifically, the method of patterning the conductive layer 3150a is, for example, on the photoresist layer on the conductive layer 3150a, while the method of forming a photoresist layer is, for example adhering photoresist dry film or coating liquid photoresist. Next, the photoresist layer is subjected to an exposure process and a development process to form a patterned photoresist layer. Next, the etching process is performed on the conductive layer 3150a, using the patterned photoresist layer as a mask, to form the circuit layer 3150. The structure of the circuit board 3100 with embedded passive component will be described later.

Still referring to FIG. 8C, the circuit board 3100 with embedded passive component includes a circuit unit 3110, a dielectric layer 3120 and a dielectric layer 3130, a passive component material layer 3140 and a circuit layer 3150. Wherein, the circuit unit 3110 includes a core layer 3112 and circuit layers 3114 and 3116 which are respectively located on two opposite surfaces of the core layer 3112. Even though the circuit unit 3110 of the present embodiment is a dual-layer circuit unit, however the circuit unit 3100 can also be a single-layer circuit unit. In other words, the present embodiment does not limit the number of circuit layers of the circuit unit 3110.

The dielectric layers 3120 and 3130 are located between the circuit layer 3150 and the circuit unit 3110, wherein the dielectric layer 3130 includes through holes 3130a. In addition, the thickness of the fiber layer 3132 is, for example, between 10 micrometers to 25 micrometers, and the thickness of the resin 3134 is, for example, between 10 micrometers and 20 micrometers (as shown in dotted line area). In other words, the thickness of the dielectric layer 3120 is thus, for example, between 30 micrometers and 65 micrometers. In addition, the structures of dielectric layer 3120 and 3130 can be the same. In other words, the dielectric layer 3120 can also include a fiber layer and two resin layers (not shown) located respectively on two opposite surfaces of the fiber layer. However, the structure of the dielectric layer 3120 and 3130 can also be different.

The passive component material layer 3140 is embedded in the through holes 3130a of the dielectric layer 3130. Remarkably, the thickness of the dielectric layer 3130 and the thickness of the passive component material layer 3140 are preferably the same. However, the difference between the thickness of the dielectric layer 3130 and the thickness of the passive component material layer 3140 can be within a tolerable range. Similarly, the present embodiment is not limited to that the thickness of the passive component material layer 3140 and the thickness of the single-layer dielectric layer are the same, but the thickness of the passive component material layer 3140 can also be the same as the total thickness of a multi-layer dielectric layer with through holes.

In addition, the circuit layer 3150 covers the dielectric layer 3130 and the passive component material layer 3140. Since the thickness of the dielectric layer usually has specific requirement, depending on the thickness difference of the passive component material layer 3140, the passive component material layer 3140 can also be embedded in multi-layer dielectric layers at the same time. Moreover, the circuit layer 3150 includes electrodes 3152 and 3154 which are insulated each other, wherein the electrode 3152 and 3154 are connected to the passive component material layer 3140 respectively. In other words, the passive component material layer 3140, electrodes 3152 and 3154 can form a resistor component.

As above descriptions, since the dielectric layer 3130 includes through holes 3130a, the passive component material layer 3140 is relatively not easily damaged during the laminating process. In other words, the circuit board 3100 can have better process yield and reliability. Moreover, if the thickness of the dielectric layer 3130 and thickness of the passive component material layer 3140 are the same, then the circuit board 3100 will provide a higher planarity.

FIG. 9 illustrates a cross-sectional view of the fabrication process of the circuit board with embedded passive component according to another embodiment of the present invention. With reference to FIG. 9, the circuit board 3200 of the present embodiment is similar to the above circuit board 3100, the difference is that after the passive component material layer 3220 being formed, at least an electrode layer 3230 is formed on the passive component material layer 3220 and a part of the conductive layer, wherein material of the passive component material layer 3220 is dielectric material. Moreover, the electrode 3212 of the circuit layer 3210 is connected to the electrode layer 3230, and a part of the passive component material layer 3220. Also and, a part of the electrode layer 3230 and a part of the electrode overlaps each other. In other words, the electrodes 3212 and 3214, the electrode layer 3230 and the passive component material layer 3220 can form a capacitor component. In addition, the passive component material layer 3220 and the electrode layer 3230 can respectively be a single-layer structure or a multi-layer structure.

Similarly, the total thickness of the preferred passive component material layer 3220 and the electrode layer 3230 equals to the thickness of the dielectric layer 3130. However, the total thickness of the passive component material layer 3220 and the electrode layer 3230 can be different from the thickness of the dielectric layer 3130 by a tolerable range. In addition, the total thickness of the passive component material layer 3220 and the electrode layer 3230 can also be equal to a total thickness of the multi-layer dielectric layer. In other words, the multi-layer dielectric layer includes through holes. The passive component material layer 3220 and the electrode layer 3230 are embedded in the through holes of the multi-layer dielectric layer at the same time.

Remarkably, after the circuit layer 3210 is formed, a circuit layer 3260 can also be formed on the other surface of the circuit unit 3110. For example, the dielectric layer 3240, 3250 and a conductive layer are laminated to the circuit unit 3110, and then the conductive layer is patterned to form a circuit layer 3260. Remarkably, the present embodiment does not limit the forming sequence of the circuit layers 3260 and 3210. Moreover, for the above circuit board 3100, a circuit layer can also be formed on another surface of the circuit unit 3110.

Comparing with the conventional technology, since the dielectric layer for lamination includes through holes, the passive component material layer of the circuit board is relatively not easily damaged during the lamination process. In other words, the circuit board of the present invention provides a better yield and reliability.

In addition, comparing with the conventional technology, since the thickness of the dielectric layer with through holes is equal to the thickness of the passive component material layer (or the total thickness of the passive component material layer and the electrode layer), therefore, the circuit board of the present invention has a higher planarity.

In addition, the fabrication process of the circuit board of the present invention is compatible with the conventional fabrication process. Therefore, the products yield and reliability can be increased, and the planarity of the products can be improved without adding additional fabricating equipment.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A fabrication process of a circuit board with embedded passive component, comprising:

providing a circuit unit having a first conductive layer, a second conductive layer and at least one passive component material layer, wherein the first conductive layer and the second conductive layer are respectively located on two opposite surfaces of the circuit unit, and the second conductive layer covers the passive component material layer, and the second conductive layer comprises at least one component area, and the passive component material layer is located over the component area of the second conductive layer;

forming a first photoresist layer and a second photoresist layer, respectively covering the first conductive layer and the second conductive layer;

patterning the first photoresist layer;

performing a first etching process on the first conductive layer to form a first circuit layer;

removing the patterned first photoresist layer and the second photoresist layer;

forming a third photoresist layer and a fourth photoresist layer covering the first circuit layer and the second conductive layer respectively;

patterning the fourth photoresist layer; and performing a second etching process and a third etching process on the second conductive layer to form a second circuit layer, wherein the second etching process uses an acid etchant, while the third etching process uses a alkaline etchant.

2. The fabrication process of the circuit board with embedded passive component of claim 1, wherein the second circuit layer further comprises a first electrode and a second electrode insulated from the first electrode, and the first electrode and the second electrode are connected to the passive component material layer respectively, and a material of the passive component material layer comprises a resistor material or an inductor material.

3. The fabrication process of the circuit board with embedded passive component of claim 1, wherein the circuit unit further comprises at least one electrode layer located on the passive component material layer and the component area, and the second circuit layer further comprises a first electrode and a second electrode, wherein the first electrode is connected to the electrode layer, and the at least a part of the electrode layer overlaps with at least a part of the second electrode, and a material of the passive component material layer comprises a capacitor material, wherein the capacitor material comprises barium titanate.

4. The fabrication process of the circuit board with embedded passive component of claim 1, after performing the second etching process and the third etching process on the second conductive layer, further comprising removing the patterned fourth photoresist layer and the third photoresist layer.

5. A fabrication process of a circuit board with embedded passive component, comprising:

providing a conductive layer, a first dielectric layer, a second dielectric layer and a circuit unit, wherein a passive component material layer has been formed on a part of area of the conductive layer, at least one through hole has been formed in the second dielectric layer, the conductive layer and the second dielectric layer are separate and unattached layers, the second dielectric layer is a prepreg and the second dielectric layer comprises a fiber layer and two resin layers located respectively on two facing surfaces of the fiber layer;

laminating the conductive layer, the first dielectric and the second dielectric layer to one of the surface of the circuit unit, wherein the passive component material layer is embedded in the through holes of the second dielectric layer, and the first dielectric layer and the second dielectric layer are located between the conductive layer and the circuit unit, and the first dielectric layer is located between the second dielectric layer and the circuit; and patterning the conductive layer to form a circuit layer.

6. The fabrication process of the circuit board with embedded passive component of claim 5, wherein the step of laminating the conductive layer, the first dielectric layer and the second dielectric layer to the surface of the circuit unit comprise:

riveting the conductive layer and the second dielectric layer, wherein the passive component material layer is embedded in the through holes of the second dielectric layer; and laminating the riveted conductive layer, the second dielectric layer and the first dielectric layer to the surface of the circuit unit.

7. The fabrication process of the circuit board with embedded passive component of claim 5, wherein the circuit layer comprises a first electrode and a second electrode layer insulted from the first electrode, and the first electrode and the second electrode are connected to the passive component material layer respectively, and a material of the passive component material layer can be resistor material or inductor material.

8. The fabrication process of the circuit board with embedded passive component of claim 5, before laminating the conductive layer, the first dielectric layer and the second dielectric layer to the surface of the circuit unit, further comprising forming at least one electrode layer on the passive component material layer and a part of the conductive layer, and the circuit layer comprises a first electrode and a second electrode insulted from the first electrode after patterning the conductive layer, wherein the first electrode is connected to the electrode layer, and the passive component material layer is located between the electrode layer and the second electrode, and a material of the passive component material layer is capacitor material.

9. The fabrication process of the circuit board with embedded passive component of claim 5, wherein the circuit layer comprises a first electrode and a second electrode insulted with the first electrode, and the first electrode and the second electrode are connected to the passive component material layer respectively, and a material of the passive component material layer can be resistor material or inductor material, wherein a thickness of the second dielectric layer and a thickness of the passive component material layer are the same.

10. The fabrication process of the circuit board with embedded passive component of claim 5, further comprising an electrode layer covering the passive component material layer and a part of the circuit layer, and the circuit layer comprising a first electrode and the second electrode insulted from the first electrode, wherein the first electrode and the second electrode are connected to the electrode layer, respectively, wherein a total thickness passive component material layer and the electrode layer equals to a thickness of the second dielectric layer.

* * * * *